(12) United States Patent
Yamamoto

(10) Patent No.: US 8,040,086 B2
(45) Date of Patent: Oct. 18, 2011

(54) CURRENT DETECTOR UNIT AND MOTOR CONTROL DEVICE

(75) Inventor: Shinya Yamamoto, Hirakata (JP)

(73) Assignee: Sanyo Electric Co., Ltd., Osaka (JP)

(*) Notice: Subject to any disclaimer, the term of this patent is extended or adjusted under 35 U.S.C. 154(b) by 553 days.

(21) Appl. No.: 12/196,671

(22) Filed: Aug. 22, 2008

(65) Prior Publication Data

US 2009/0058334 A1 Mar. 5, 2009

(30) Foreign Application Priority Data

Aug. 29, 2007 (JP) .................................. 2007-221981

(51) Int. Cl.
*H02P 21/00* (2006.01)

(52) U.S. Cl. ..................... 318/400.02; 318/650; 318/801

(58) Field of Classification Search ................... 318/800, 318/801, 803, 400.01, 400.02, 400.06, 400.13, 318/650, 400.14, 400.21, 721, 799, 805, 318/811
See application file for complete search history.

(56) References Cited

U.S. PATENT DOCUMENTS

| 7,064,514 | B2* | 6/2006 | Iwaji et al. | 318/801 |
| 7,084,601 | B2* | 8/2006 | Maeda et al. | 318/806 |
| 7,173,393 | B2* | 2/2007 | Maeda et al. | 318/400.02 |
| 7,271,557 | B2* | 9/2007 | Ajima et al. | 318/400.01 |
| 7,411,369 | B2* | 8/2008 | Maeda et al. | 318/801 |
| 7,671,557 | B2* | 3/2010 | Maeda et al. | 318/729 |
| 2007/0241720 | A1* | 10/2007 | Sakamoto et al. | 318/811 |

FOREIGN PATENT DOCUMENTS

| JP | 02-197295 | 8/1990 |
| JP | 2004-064903 | 2/2004 |

* cited by examiner

*Primary Examiner* — Walter Benson
*Assistant Examiner* — Antony M Paul
(74) *Attorney, Agent, or Firm* — NDQ&M Watchstone LLP

(57) ABSTRACT

A current detector unit has a current detecting portion detecting a current flowing between a three-phase inverter and a direct-current power supply as a detection current; a three-phase current detecting portion for detecting a three-phase current of the inverter based on the detection current; and a judging portion judging, based on the detection current, whether or not a target time point belongs to a period during which the three-phase current can be detected. If the judging portion judges that the target time point belongs to the period, the three-phase current detecting portion detects the three-phase current.

5 Claims, 18 Drawing Sheets

| U | V | W | BUS CURRENT |
|---|---|---|---|
| L | L | L | - |
| L | L | H | w |
| L | H | L | v |
| L | H | H | -u |
| H | L | L | u |
| H | L | H | -v |
| H | H | L | -w |
| H | H | H | - |

DETECTED PHASE CURRENT

|  | T1 | T2 | T3 | MODE | MINIMUM PHASE | MAXIMUM PHASE |
|---|---|---|---|---|---|---|
| $v_u > v_v > v_w$ | CntW | CntV | CntU | 1 | -w | u |
| $v_v > v_u > v_w$ | CntW | CntU | CntV | 2 | -w | v |
| $v_v > v_w > v_u$ | CntU | CntW | CntV | 3 | -u | v |
| $v_w > v_v > v_u$ | CntU | CntV | CntW | 4 | -u | w |
| $v_w > v_u > v_v$ | CntV | CntU | CntW | 5 | -v | w |
| $v_u > v_w > v_v$ | CntV | CntW | CntU | 6 | -v | u |

SAMPLING TIME POINT
 ST1:T5-T6
 ST2:T2-T3

CURRENT DETECTOR UNIT AND MOTOR CONTROL DEVICE

This nonprovisional application claims priority under 35 U.S.C. §119(a) on Patent Application No. 2007-221981 filed in Japan on Aug. 29, 2007, the entire contents of which are hereby incorporated by reference.

BACKGROUND OF THE INVENTION

1. Field of the Invention

The present invention relates to current detector units for detecting a current and to motor control devices that drive and control a motor.

2. Description of Related Art

In order to perform vector control of a motor by supplying three-phase alternating-current power to the motor, it is necessary to detect two phase currents (for example, a U-phase current and a V-phase current) among three phase currents consisting of U-phase, V-phase, and W-phase currents. In general, detection of two phase currents is performed by using two current sensors (such as current transformers). However, the use of two current sensors undesirably increases overall cost of a system incorporating the motor.

It is for this reason that there has conventionally been proposed a technique by which a bus current (direct current) between an inverter and a direct-current power supply is detected with a single current sensor, and, based on the bus current thus detected, two phase currents are detected. This technique is called a single shunt current detection technique.

FIG. 19 is an overall block diagram showing a conventional motor drive system employing the single shunt current detection technique. An inverter (PWM inverter) 902 includes three half-bridge circuits provided one for each of three phases and each having an upper arm and a lower arm. The inverter 902 performs individual switching of each arm in accordance with specified three-phase voltage values fed from a controller 903, and thereby converts a direct-current voltage from a direct-current power supply 904 into a three-phase alternating-current voltage. The three-phase alternating-current voltage thus obtained is supplied to a three-phase permanent-magnet synchronous motor 901 to drive and control the motor 901.

A line connecting each lower arm provided in the inverter 902 with the direct-current power supply 904 is called a bus 913. A current sensor 905 transmits, to the controller 903, a signal indicating a bus current flowing through the bus 913. The controller 903 performs sampling of an output signal of the current sensor 905 with appropriate timing, and thereby detects a phase current of a phase with a maximum voltage level (maximum phase) and a phase current of a phase with a minimum voltage level (minimum phase), namely, two phase currents. That is, upon detection of two phase currents, a three-phase current of the inverter 902, namely a motor current, is automatically obtained.

If there is a sufficient level difference among the voltage levels of different phases, two phase currents can be detected in the above-described manner. However, if the voltage levels of the maximum phase and intermediate phase come close to each other, or the voltage levels of the minimum phase and intermediate phase come close to each other, it becomes impossible to detect two phase currents. Incidentally, the single shunt current detection technique will be described later in an embodiment of the present invention, along with the reason why it becomes impossible to detect two phase currents.

In view of this, there has been a conventional method in which the single shunt current detection technique is performed such that, if a difference between any two phase voltages is relatively large, a present motor current is detected by using present bus current information; if the difference is relatively small, a present motor current is estimated by using the bus current information detected in the past.

In this conventional method, a voltage threshold value is previously set, and the voltage threshold value thus set is compared with the difference between two phase voltages to make a judgment whether the difference is relatively large or small. However, with this conventional method, since the voltage threshold value has to be set with allowance made for various factors, there is a possibility that, although in actuality two phase currents can be detected, it is judged that they cannot be detected.

SUMMARY OF THE INVENTION

According to one aspect of the present invention, a current detector unit is provided with: a current detecting portion detecting a current flowing between a three-phase inverter and a direct-current power supply as a detection current; a three-phase current detecting portion for detecting a three-phase current of the inverter based on the detection current; and a judging portion judging, based on the detection current, whether or not a target time point belongs to a period during which the three-phase current can be detected. If the judging portion judges that the target time point belongs to the period, the three-phase current detecting portion detects the three-phase current.

Specifically, for example, the judging portion judges whether or not the target time point belongs to the period based on the magnitude of the detection current, the first-order difference value of the detection current, or the second-order difference value of the detection current.

Specifically, for example, the judging portion judges whether or not the target time point belongs to the period by comparing the magnitude of the detection current, the first-order difference value of the detection current, or the second-order difference value of the detection current with a predetermined determination threshold value, and the determination threshold value is set to a value that is equal to or smaller than one-half of a maximum value of the detection current.

According to another aspect of the present invention, a motor control device is provided with the above-described current detector unit, and drives a three-phase motor by the inverter. Here, the motor control device detects a motor current flowing through the motor based on the three-phase current detected by the current detector unit, and controls the motor via the inverter based on the motor current thus detected.

For example, if the judging portion judges that the target time point belongs to the period, the motor control device controls the motor based on the detection current detected at the target time point. If the judging portion judges that the target time point does not belong to the period, the motor control device controls the motor based on the detection current detected at a time point before the target time point.

According to still another aspect of the present invention, a motor drive system is provided with: a three-phase motor; an inverter driving the motor; and the above-described motor control device controlling the motor by controlling the inverter.

According to still another aspect of the present invention, a system interconnection device is provided with the current detector unit and the three-phase inverter. The system interconnection device converts a direct-current voltage from the direct-current power supply into a three-phase alternating-current voltage by the inverter based on the detected three-phase current, and supplies three-phase alternating-current power based on the three-phase alternating-current voltage to a load in coordination with an external three-phase alternating-current power system.

The significance and effect of the present invention will become more apparent from the following detailed description of preferred embodiments thereof. It is to be understood that the significance of the present invention and the significance of terms describing the component elements thereof are not limited in any way by those specifically described in the embodiments below, because those embodiments are merely examples of how the invention can be implemented.

BRIEF DESCRIPTION OF THE DRAWINGS

FIG. 6 is a table showing combinations (modes) of the phase voltages in the motor shown in FIG. 1, the combinations depending on which of the three voltages is at the highest, intermediate, and lowest level, and the phase of current detected in each combination;

DETAILED DESCRIPTION OF PREFERRED EMBODIMENTS

Hereinafter, the present invention will be described by way of specific embodiments with reference to the accompanying drawings. Among these drawings, such parts that appear more than once are identified with common reference designations, and in principle the description of any part, once given, will not be repeated. First, matters common to Examples 1 to 4, which will be described later, or matters to which reference is made in these Examples will be described.

Figure 1:
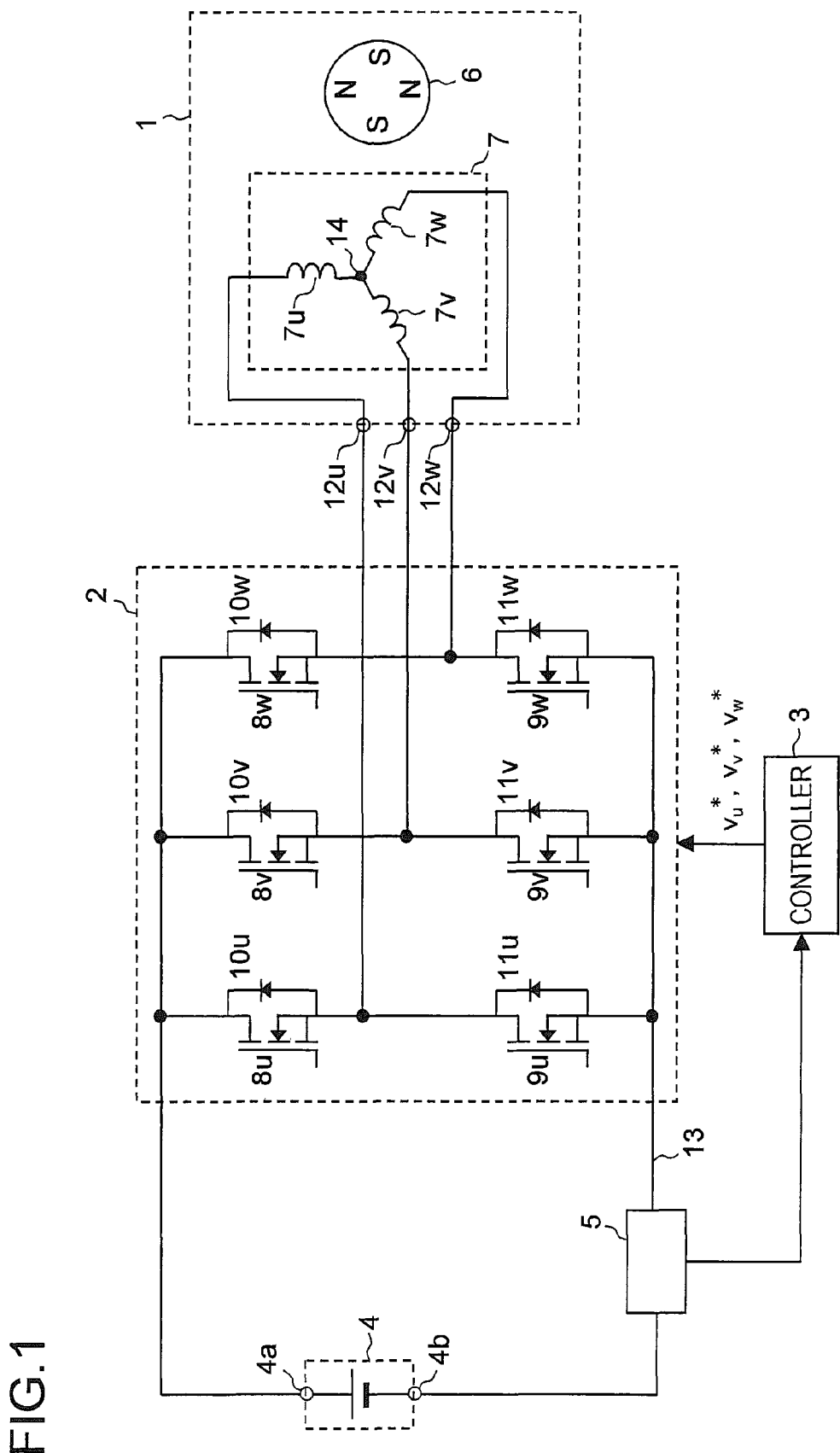
FIG. 1 is a block diagram showing the overall configuration of a motor drive system according to an embodiment of the invention.

FIG. 1 is a block diagram showing the configuration of a motor drive system according to an embodiment of the invention. The motor drive system shown in FIG. 1 includes a three-phase permanent-magnet synchronous motor 1 (hereinafter referred to simply as a "motor 1"), a PWM (pulse width modulation) inverter 2 (hereinafter referred to simply as an "inverter 2"), a controller 3, a direct-current power supply 4, and a current sensor 5. The direct-current power supply 4 delivers a direct-current voltage between a positive output terminal 4a and a negative output terminal 4b, with the negative output terminal 4b serving as a lower voltage side. The motor drive system shown in FIG. 1 adopts the single shunt current detection technique.

The motor 1 includes a rotor 6 on which a permanent magnet is provided, and a stator 7 on which U-phase, V-phase, and W-phase armature windings 7u, 7v, and 7w are provided. The armature windings 7u, 7v, and 7w are each connected to a neutral point 14 so as to form a Y-connection. The armature windings 7u, 7v, and 7w are connected, at their non-connection nodes facing away from the neutral point 14, to terminals 12u, 12v, and 12w, respectively.

The inverter 2 includes a half-bridge circuit for the U-phase, a half-bridge circuit for the V-phase, and a half-bridge circuit for the W-phase. Each half-bridge circuit has a pair of switching elements. In each half-bridge circuit, the pair of switching elements is connected in series between the positive output terminal 4a and the negative output terminal 4b of the direct-current power supply 4. As a result, the direct-current voltage from the direct-current power supply 4 is applied to each half-bridge circuit.

The half-bridge circuit for the U-phase is composed of a switching element 8u (hereinafter also referred to as an "upper arm 8u") on a higher voltage side and a switching element 9u (hereinafter also referred to as a "lower arm 9u") on a lower voltage side. The half-bridge circuit for the V-phase is composed of a switching element 8v (hereinafter also referred to as an "upper arm 8v") on a higher voltage side and a switching element 9v (hereinafter also referred to as a "lower arm 9v") on a lower voltage side. The half-bridge circuit for the W-phase is composed of a switching element 8w (hereinafter also referred to as an "upper arm 8w") on a higher voltage side and a switching element 9w (hereinafter also referred to as a "lower arm 9w") on a lower voltage side. To the switching elements 8u, 8v, 8w, 9u, 9v, and 9w, diodes 10u, 10v, 10w, 11u, 11v, and 11w are respectively connected in parallel in such a way that the forward directions thereof point in the direction from the lower voltage side of the direct-current power supply 4 to the higher voltage side thereof. The diodes each function as a free-wheel diode.

A node at which the upper arm 8u and the lower arm 9u are connected in series, a node at which the upper arm 8v and the lower arm 9v are connected in series, and a node at which the upper arm 8w and the lower arm 9w are connected in series are connected to the terminals 12u, 12v, and 12w, respectively. In FIG. 1, a field-effect transistor is shown as an example of the switching element; however, it is also possible to use an IGBT (insulated-gate bipolar transistor) or the like as a substitute for the field-effect transistor.

The inverter 2 produces PWM signals (pulse width modulation signals) for different phases based on specified three-phase voltage values fed from the controller 3, and feeds the PWM signals thus produced to the control terminals (base or gate) of switching elements provided in the inverter 2, so as to make the switching elements perform switching operation. The specified three-phase voltage values fed to the inverter 2 from the controller 3 include a specified U-phase voltage value $v_u^*$, a specified V-phase voltage value $v_v^*$, and a specified W-phase voltage value $v_w^*$ representing the voltage levels (voltage values) of a U-phase voltage $v_u$, a V-phase voltage $v_v$, and a W-phase voltage $v_w$, respectively. The U-phase voltage $v_u$, the V-phase voltage $v_v$, and the W-phase voltage $v_w$ are voltages at the terminals 12u, 12v, and 12w, respectively, as seen from the neutral point 14 shown in FIG. 1. Based on $v_u^*$, $v_v^*$, and $v_w^*$, the inverter 2 controls on/off of each switching element (brings it into/out of conduction).

Let the dead time that is inserted for preventing the upper arm and the lower arm of the same phase from being simultaneously turned on be ignored. Then, in each half-bridge circuit, when the upper arm is on, the lower arm is off, when the upper arm is off, the lower arm is on. Hereinafter, it is assumed that the dead time is ignored.

The direct-current voltage applied to the inverter 2 by the direct-current power supply 4 is modulated by using PWM (pulse width modulation) by the switching operation of the switching elements provided in the inverter 2, and is converted into a three-phase alternating-current voltage. When the three-phase alternating-current voltage thus obtained is applied to the motor 1, currents commensurate with the three-phase alternating-current voltage flow through the armature windings (7u, 7v, and 7w), whereby the motor 1 is driven.

The current sensor 5 detects a current (hereinafter referred to as a "bus current") flowing through the bus 13 of the inverter 2. Since the bus current has a direct-current component, it can be considered as an equivalent of a direct current. In the inverter 2, the lower arms 9u, 9v, and 9w are connected together at the lower voltage sides thereof, and are connected to the negative output terminal 4b of the direct-current power supply 4. A conductor to which the lower arms 9u, 9v, and 9w are connected together at the lower voltage sides thereof is the bus 13, and the current sensor 5 is connected in series to the bus 13. The current sensor 5 transmits, to the controller 3, a signal indicating a current value of the detected bus current (detection current). The controller 3 produces the specified three-phase voltage values by referring to the output signal, for example, of the current sensor 5, and outputs the specified three-phase voltage values thus produced. Incidentally, the current sensor 5 is, for example, a shunt resistor or a current transformer. The current sensor 5 may be connected to a conductor via which the upper arms 8u, 8v, and 8w are connected at the higher voltage sides thereof to the positive output terminal 4a, instead of connecting to the conductor (bus 13) via which the lower arms 9u, 9v, and 9w are connected at the lower voltage sides thereof to the negative output terminal 4b.

Here, with reference to FIGS. 2, 3, 4, 5A to 5D, and 6, a description will be given of, for example, a relationship between bus current and phase current flowing through an armature winding of each phase. The currents flowing through the armature windings 7u, 7v, and 7w are referred to as a U-phase current, a V-phase current, and a W-phase current, respectively, which are individually (or collectively) referred to as a phase current (see FIG. 1). The following description assumes that the polarity of a phase current flowing into the neutral point 14 from the terminals 12u, 12v, or 12w is positive, and the polarity of a phase current flowing from the neutral point 14 is negative.

Figures 2, 3:
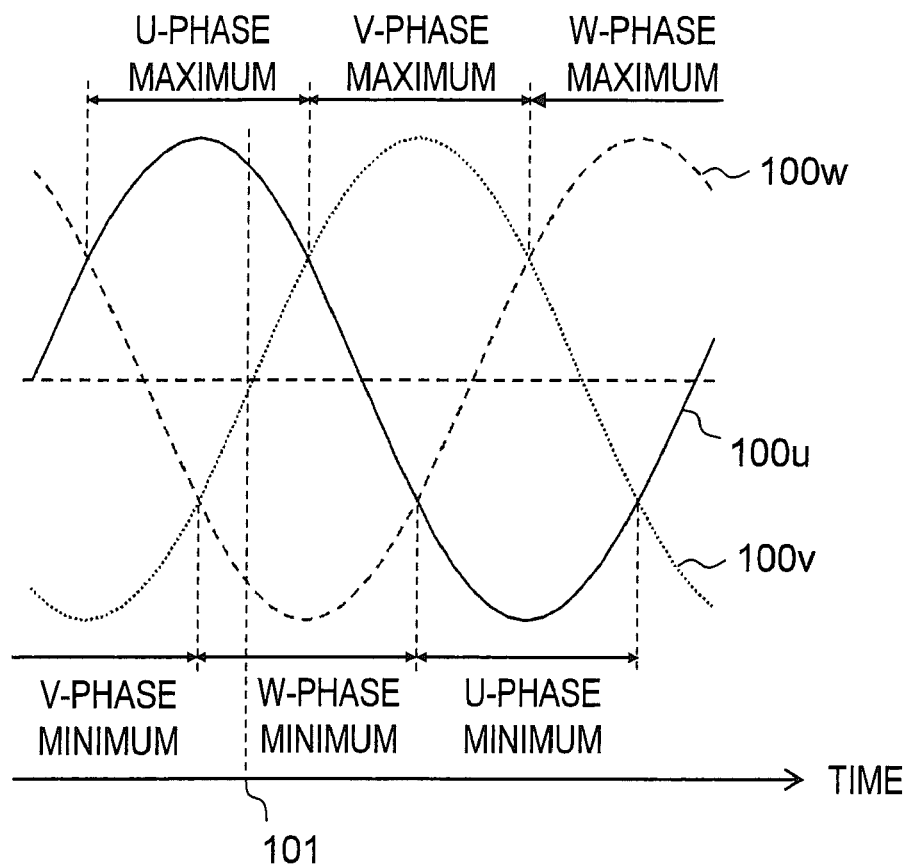
FIG. 2 is a diagram showing a typical example of the three-phase alternating-current voltage applied to the motor shown in FIG. 1.
FIG. 3 is a table showing different patterns of energizing the motor shown in FIG. 1, and a relationship between energizing pattern and bus current.

FIG. 2 is a diagram showing a typical example of the three-phase alternating-current voltage applied to the motor 1. This three-phase alternating-current voltage is composed of three sinusoidal alternating-current voltages of the same amplitude but with a phase difference of 120 degrees. In FIG. 2, reference characters 100u, 100v, and 100w represent the waveforms of the U-phase voltage, the V-phase voltage, and W-phase voltage, respectively, to be applied to the motor 1. The U-phase voltage, the V-phase voltage, and the W-phase voltage are individually (or collectively) referred to as a phase voltage. If a sinusoidal current is passed through the motor 1, the inverter 2 outputs a voltage having a sinusoidal waveform.

As shown in FIG. 2, which of the U-phase voltage, the V-phase voltage, and the W-phase voltage is at the highest, intermediate, and lowest level varies with time. Which of the three voltages is at the highest, intermediate, and lowest level depends on the specified three-phase voltage values, and the inverter 2 determines an energizing pattern of different phases according to the specified three-phase voltage values. This energizing pattern is shown in FIG. 3 as a table. FIG. 3 shows, from the left, different energizing patterns in the first to third columns; the fourth column will be described later.

The energizing patterns are an energizing pattern "LLL" in which all the lower arms of the U-, V-, and W-phases are on;

an energizing pattern "LLH" in which the upper arm of the W-phase is on, and the lower arms of the U- and V-phases are on;

an energizing pattern "LHL" in which the upper arm of the V-phase is on, and the lower arms of the U- and W-phases are on;

an energizing pattern "LHH" in which the upper arms of the V- and W-phases are on, and the lower arm of the U-phase is on;

an energizing pattern "HLL" in which the upper arm of the U-phase is on, and the lower arms of the V- and W-phases are on;

an energizing pattern "HLH" in which the upper arms of the U- and W-phases are on, and the lower arm of the V-phase is on;

an energizing pattern "HHL" in which the upper arms of the U- and V-phases are on, and the lower arm of the W-phase is on; and an energizing pattern "HHH" in which all the upper arms of the U-, V, and W-phases are on (in the description above, reference characters (e.g., 8u) of the upper and lower arms are omitted).

Figure 4:
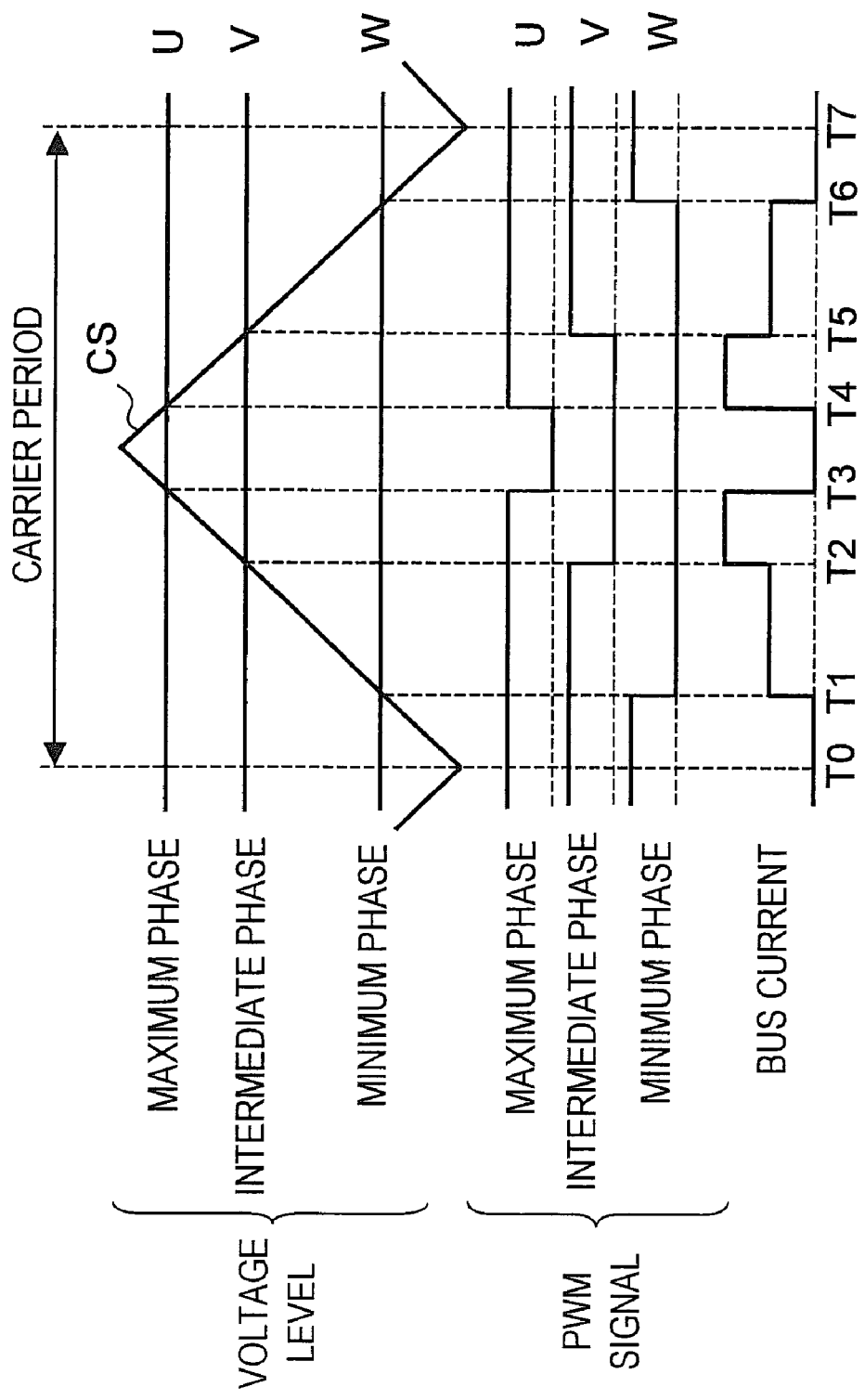
FIG. 4 is a diagram showing a relationship between voltage levels of different phase voltages and carrier signal in the motor shown in FIG. 1, and the corresponding waveforms of the PWM signals and the bus current.

FIG. 4 shows a relationship between voltage levels of different phase voltages and carrier signal in a case where three-phase modulation is performed, and the corresponding waveforms of the PWM signals and the bus current. Since which of the phase voltages is at the highest, intermediate, and lowest level varies, FIG. 4 deals with a time point 101 shown in FIG. 2 for the sake of concreteness. That is, FIG. 4 shows a state in which the U-phase voltage is at the highest level, and the W-phase voltage is at the lowest level. Hereinafter, a phase whose voltage level is the highest is referred to as a "maximum phase", a phase whose voltage level is the lowest is referred to as a "minimum phase", and a phase whose voltage level is neither the highest nor the lowest is referred to as an "intermediate phase". In the state shown in FIG. 4, the maximum phase, the intermediate phase, and the minimum phase are the U-phase, the V-phase, and the W-phase, respectively. In FIG. 4, reference character CS represents a carrier signal to be compared with the voltage level of each phase voltage. The carrier signal is a periodic triangular wave signal, and the period of this signal is called a carrier period. It is to be noted that the carrier period is much shorter than the period of the three-phase alternating-current voltage shown in FIG. 2.

Referring to FIGS. 5A to 5D in addition to the aforementioned drawings, a relationship between phase current and bus current will be described. FIGS. 5A to 5D are each an equivalent circuit diagram of a part around the armature winding, each showing a state in a given period of time shown in FIG. 4.

Figure 5A:
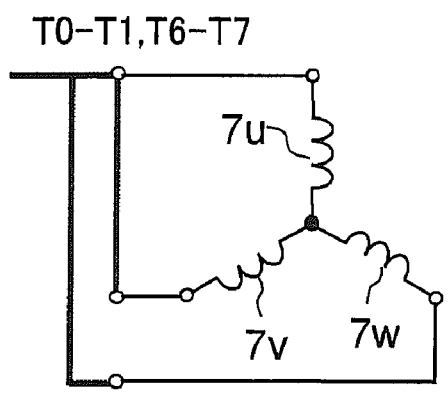
FIGS. 5A to 5D are each an equivalent circuit diagram of a part of FIG. 1 around the armature winding, each showing a state in a given period of time shown in FIG. 4.

A time point at which a carrier period starts, that is, a time point at which the carrier signal is at the lowest level, is referred to as T0. At time point T0, the upper arms (8u, 8v, and 8w) of all the phases are turned on. In this case, since no current flows through the direct-current power supply 4 due to formation of a short circuit, as shown in FIG. 5A, the bus current is zero.

Figure 5B:
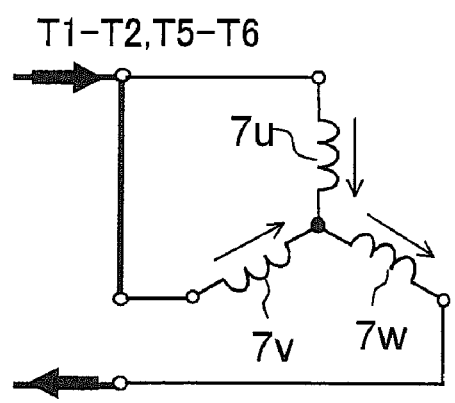

The inverter 2 compares the voltage level of each phase voltage with the carrier signal by referring to $v_u^*$, $v_v^*$, and $v_w^*$. The level (voltage level) of the carrier signal starts to increase, and, when the voltage level of the minimum phase crosses the carrier signal at time point T1, the lower arm of the minimum phase is turned on. As a result, as shown in FIG. 5B, the current of the minimum phase flows as the bus current. In the example shown in FIG. 4, from time point T1 to time point T2, which will be described later, since the lower arm 9w of the W-phase is on, the W-phase current (with negative polarity) flows as the bus current.

Figure 5C:
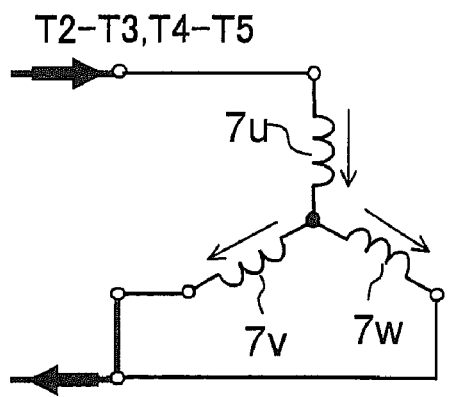

Then, the level of the carrier signal further increases, and, when the voltage level of the intermediate phase crosses the carrier signal at time point T2, the upper arm of the maximum phase is turned on, and the lower arms of the intermediate phase and the minimum phase are turned on. As a result, as shown in FIG. 5C, the current of the maximum phase flows as the bus current. In the example shown in FIG. 4, from time point T2 to time point T3, which will be described later, since the upper arm 8u of the U-phase and the lower arms 9v and 9w of the V- and W-phases are on, the U-phase current (with positive polarity) flows as the bus current.

Figure 5D:
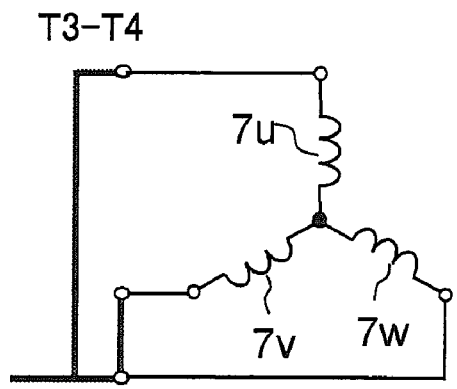

Then, the level of the carrier signal further increases, and, when the voltage level of the maximum phase crosses the carrier signal at time point T3, the lower arms of all the phases are turned on. In this case, since no current flows through the direct-current power supply 4 due to formation of a short circuit, as shown in FIG. 5D, the bus current is zero.

After the carrier signal reaches its highest level at a time point between time point T3 and time point T4, which will be described later, the level of the carrier signal starts to decrease. As the level of the carrier signal decreases, the states shown in FIGS. 5D, 5C, 5B, and 5A appear in this order. That is, when the level of the carrier signal decreases, let a time point at which the voltage level of the maximum phase crosses the carrier signal, a time point at which the voltage level of the intermediate phase crosses the carrier signal, a time point at which the voltage level of the minimum phase crosses the carrier signal, and a time point at which the next carrier period starts be referred to as T4, T5, T6, and T7. Then, the energizing patterns between time points T4 and T5, between time points T5 and T6, and between time points T6 and T7 are the same as those between time points T2 and T3, between time points T1 and T2, and between time points T0 and T1, respectively.

Therefore, for example, by detecting the bus current between time points T1 and T2 or between time points T5 and T6, it is possible to detect the current of the minimum phase based on the bus current thus detected; by detecting the bus current between time points T2 and T3 or between time points T4 and T5, it is possible to detect the current of the maximum phase based on the bus current thus detected. For the current of the intermediate phase, it can be obtained by calculation by exploiting the fact that the total sum of the three-phase current values is zero. In the fourth column of the table of FIG. 3, the phase of a current flowing as the bus current in each energizing pattern is shown with the polarity of the current. For example, in the energizing pattern "HHL" given in the eighth row of the table of FIG. 3, the W-phase current (with negative polarity) flows as the bus current.

It is to be noted that, in the carrier period, a time period other than a time period between time points T1 and T6 represents the pulse width of the PWM signal for the minimum phase, a time period other than a time period between time points T2 and T5 represents the pulse width of the PWM signal for the intermediate phase, and a time period other than a time period between time points T3 and T4 represents the pulse width of the PWM signal for the maximum phase.

It is to be understood that the description heretofore assumes, as an example, a case in which the U-phase is the maximum phase and the W-phase is the minimum phase. However, six different combinations of the maximum phase, the intermediate phase, and the minimum phase are possible. These combinations are presented in a table of FIG. 6. Let the U-phase voltage, the V-phase voltage, and the W-phase voltage be represented by $v_u$, $v_v$, and $v_w$, respectively. Then, a state in which $v_u > v_v > v_w$ holds is referred to as a first mode;

a state in which $v_v > v_u > v_w$ holds is referred to as a second mode;

a state in which $v_v > v_w > v_u$ holds is referred to as a third mode;

a state in which $v_w > v_v > v_u$ holds is referred to as a fourth mode;

a state in which $v_w > v_u > v_v$ holds is referred to as a fifth mode; and a state in which $v_u > v_w > v_v$ holds is referred to as a sixth mode.

The example shown in FIGS. 4 and 5A to 5D corresponds to the first mode. FIG. 6 also shows the phase of a current detected in each mode.

Specifically, the U-phase specified voltage value $v_u^*$, the V-phase specified voltage value $v_v^*$, and the W-phase specified voltage value $v_w^*$ are expressed as counter set values CntU, CntV, and CntW, respectively. The higher the phase voltage, the greater the set value assigned thereto. For example, in the first mode, CntU>CntV>CntW holds.

A counter (unillustrated) provided in the controller 3 counts up, starting from 0, from time point T0 every carrier period. When the count reaches CntW, switching is performed from a state in which the upper arm 8w of the W-phase is on to a state in which the lower arm 9w thereof is on. When the count reaches CntV, switching is performed from a state in which the upper arm 8v of the V-phase is on to a state in which the lower arm 9v thereof is on. When the count reaches CntU, switching is performed from a state in which the upper arm 8u of the U-phase is on to a state in which the lower arm 9u thereof is on. After the carrier signal reaches its maximum level, the count is counted down, and switching operation is performed the other way around.

Therefore, in the first mode, time points at which the count reaches CntW, CntV, and CntU while the count is being counted up correspond to time points T1, T2, and T3, respectively; time points at which the count reaches CntU, CntV, and CntW while the count is being counted down correspond to time points T4, T5, and T6, respectively. Similarly, in the second mode, time points at which the count reaches CntW, CntU, and CntV while the count is being counted up correspond to time points T1, T2, and T3, respectively; time points at which the count reaches CntV, CntU, and CntW while the count is being counted down correspond to time points T4, T5, and T6, respectively. The same holds true for the third to sixth modes.

In this embodiment, it is assumed that a phase current of the minimum phase is detected between time points T5 and T6, and a phase current of the maximum phase is detected between time points T2 and T3. In addition, a sampling time point for detecting a phase current of the minimum phase is represented by symbol ST1, and a sampling time point for detecting a phase current of the maximum phase is represented by symbol ST2.

Based on the above-described principles, it is possible to detect each phase current based on the bus current. As will be understood from FIG. 4, however, if the voltage levels of the maximum phase and intermediate phase come close to each other, for example, a time interval between time points T2 and T3 and a time interval between time points T4 and T5 are decreased. Since the bus current is detected by converting an analog output signal from the current sensor 5 shown in FIG. 1 into a digital signal, if these time intervals are extremely decreased, it becomes impossible to provide sufficient time for A/D conversion or for ending ringing (a current ripple induced by switching). This makes it impossible to detect a phase current of the maximum phase. Similarly, if the voltage levels of the minimum phase and intermediate phase come close to each other, it becomes impossible to detect a phase current of the minimum phase. If two phase currents cannot be detected, it is impossible to reconstruct three phase currents, making it impossible to control the motor 1 in an adequate manner.

Hereinafter, a period during which two phase currents cannot be detected due to a small difference between any two phase voltages among three phase voltages is referred to as a "current undetectable period", and a period other than the current undetectable period is referred to as a "current detectable period". Any time point belongs to the current detectable period or the current undetectable period. One feature of this embodiment lies in a method of judging whether or not an arbitrary time point is in the current undetectable period (hereinafter a "current undetectable period judging method").

Current Undetectable Period Judging Method

Figure 7:
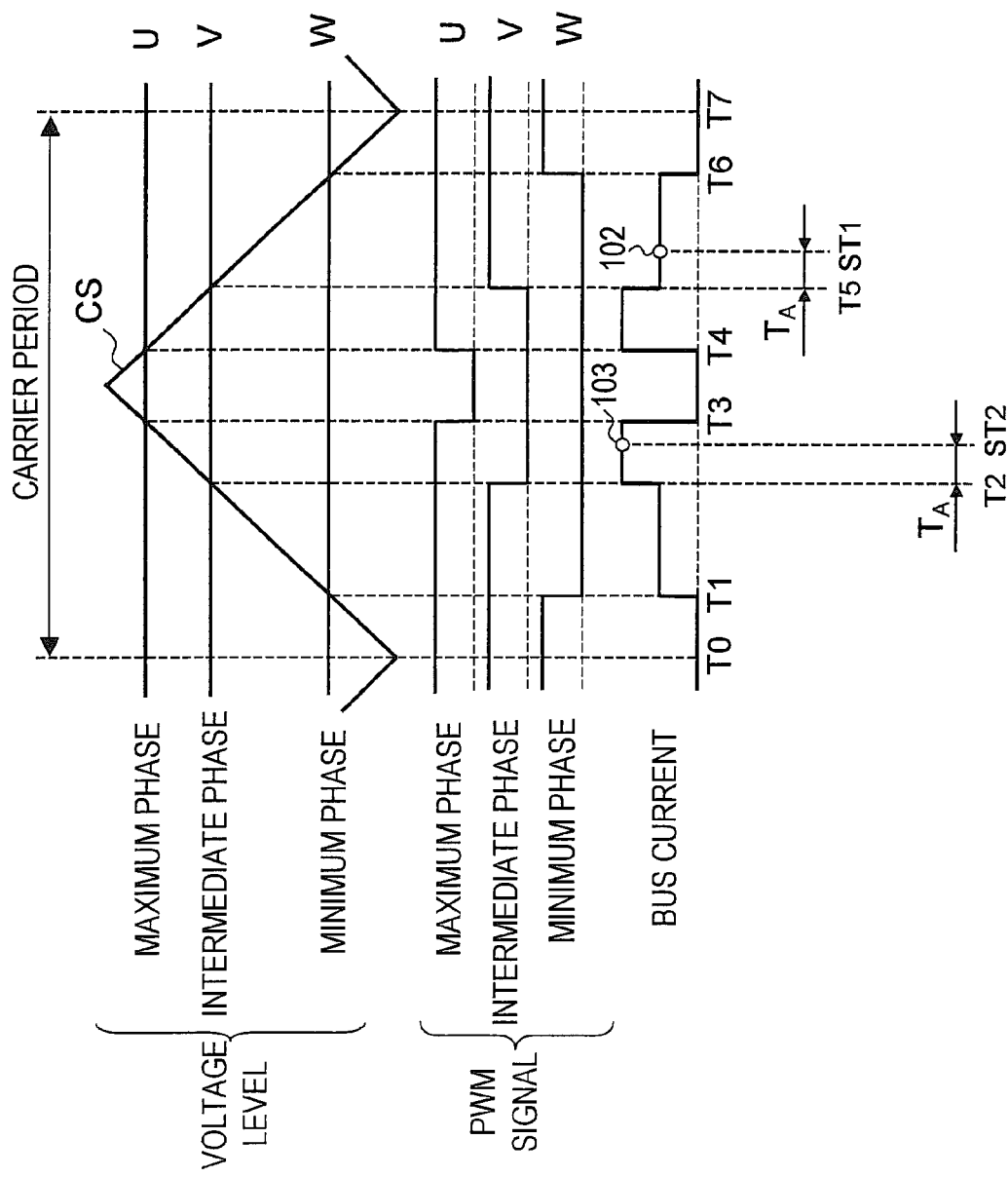
FIG. 7 is a diagram showing a modified version of FIG. 4, to which a sampling time point ST1 for detecting a phase current of the minimum phase and a sampling time point ST2 for detecting a phase current of the maximum phase are added, corresponding to a current detectable period.
Figure 8:
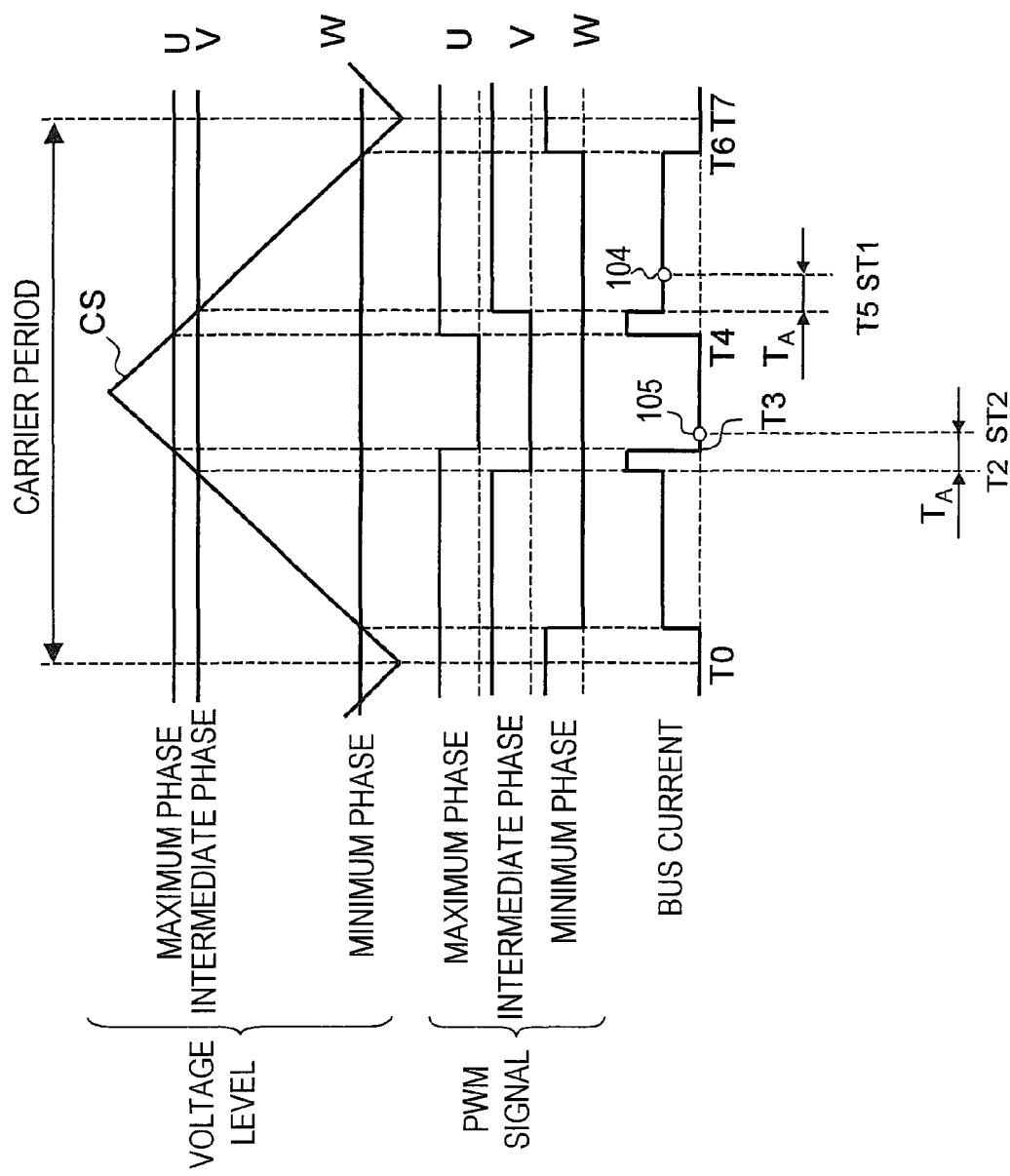
FIG. 8 is a diagram showing a modified version of FIG. 4, to which a sampling time point ST1 for detecting a phase current of the minimum phase and a sampling time point ST2 for detecting a phase current of the maximum phase are added, corresponding to a current undetectable period.

A current undetectable period judging method according to this embodiment will be described. FIGS. 7 and 8 are each a diagram showing a modified version of FIG. 4, to which a sampling time point ST1 for detecting a phase current of the minimum phase and a sampling time point ST2 for detecting a phase current of the maximum phase are added. Hereinafter, the sampling time points ST1 and ST2 are also referred to simply as ST1 and ST2.

ST1 is a time point at which time $T_A$ has passed from time point T5, and ST2 is a time point at which time $T_A$ has passed from time point T2. Time $T_A$ can be previously set at the design stage of the motor drive system with consideration given to, for example, time for ending ringing in the bus current resulting from switching, or a sampling time delay associated with A/D conversion performed on the analog output signal of the current sensor 5. As described above, the specified three-phase voltage values ($v_u^*$, $v_v^*$, and $v_w^*$) are expressed as counter set values CntU, CntV, and CntW, respectively, and time points T2 and T5 are determined by the counter set values CntU, CntV, and CntW. In addition, a count corresponding to time $T_A$ is set. This allows the controller 3 to determine the sampling time points ST1 and ST2 in each carrier period based on the specified three-phase voltage values.

FIG. 7 corresponds to a current detectable period. In the current detectable period shown in FIG. 7, it is possible to detect the bus current accurately because a difference between the voltage levels of different two phase voltages is relatively large. In FIG. 7, reference numerals 102 and 103 represent a phase current of the minimum phase detected at ST1 and a phase current of the maximum phase detected at ST2, respectively.

On the other hand, FIG. 8 corresponds to a current undetectable period. In the current undetectable period shown in FIG. 8, it is impossible to detect a phase current of the maximum phase at ST2 because the voltage levels of the maximum phase and intermediate phase are too close to each other. In FIG. 8, although reference numeral 104 represents a phase current of the minimum phase detected at ST1, reference numeral 105 represents a current that is different from a phase current of the maximum phase detected at ST2.

Figure 9A:
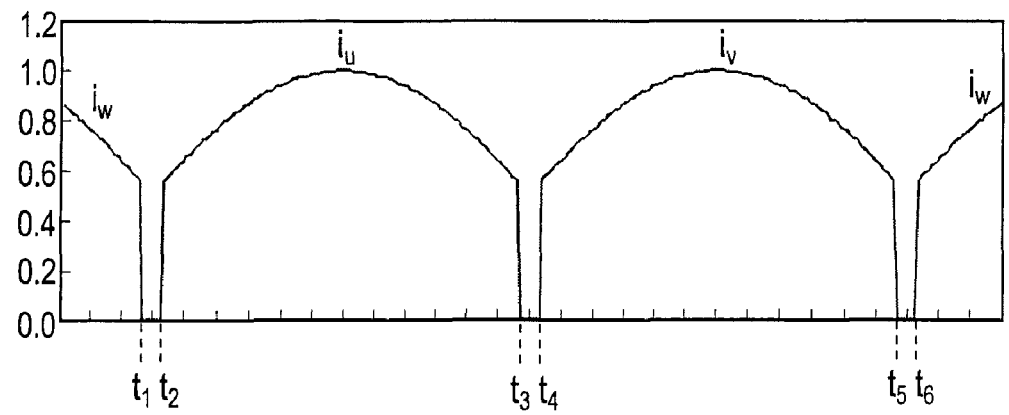
FIG. 9A is a diagram showing the simulation results indicating how the detected bus current varies with time.
Figure 9B:
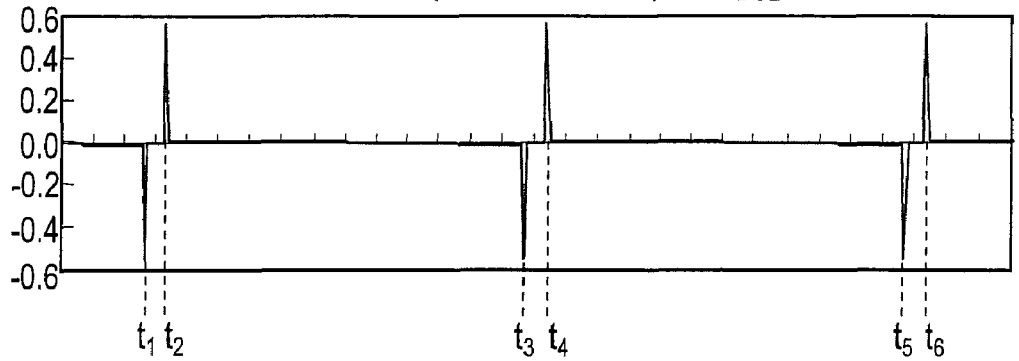
FIG. 9B is a diagram showing the simulation results indicating how the first-order difference value of the detected bus current varies with time.
Figure 9C:
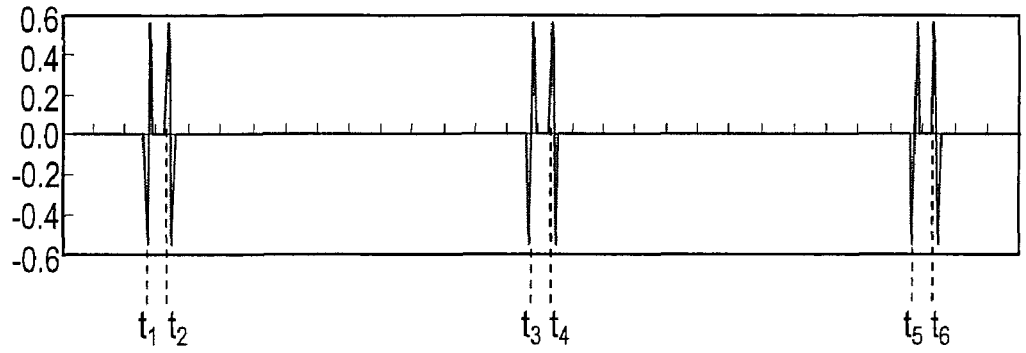
FIG. 9C is a diagram showing the simulation results indicating how the second-order difference value of the detected bus current varies with time.

FIG. 9A shows how the bus current detected at the sampling time point ST2 in each carrier period varies with time. FIG. 9B shows the first-order difference value of the bus current detected at the sampling time point ST2 in each carrier period varies with time. FIG. 9C shows how the second-order difference value of the bus current detected at the sampling time point ST2 in each carrier period varies with time. Here, the bus current detected at the sampling time point ST2 is represented by $I_{DC2}$. It is to be noted that, in FIG. 9A, ideal bus current values based on simulation are plotted, and, in FIGS. 9B and 9C, first-order difference values and second-order difference values calculated based on these ideal bus current values are plotted, respectively.

In FIGS. 9A, 9B, and 9C, the horizontal axis represents time, and the vertical axis represents a current value. Although the maximum value of the bus current $I_{DC2}$ is determined depending on, for example, a direct-current voltage value outputted from the direct-current power supply 4 shown in FIG. 1, the maximum value of the bus current $I_{DC2}$ here is normalized to 1.0. In this case, the bus current $I_{DC2}$ takes a value between 0 and 1.0. Now, suppose that there are different time points $t_1$, $t_2$, $t_3$, $t_4$, $t_5$, and $t_6$, and time passes in order $t_1$, $t_2$, $t_3$, $t_4$, $t_5$, and $t_6$. In addition, suppose that time periods between time points $t_1$ and $t_2$, between time points $t_3$ and $t_4$, and between time points $t_5$ and $t_6$ belong to a period during which a phase current of the maximum phase cannot be detected based on the bus current $I_{DC2}$.

A period after time point $t_2$ and before time point $t_3$ belongs to a period during which a phase current of the maximum phase can be detected based on the bus current $I_{DC2}$. During that period, a phase current of the maximum phase is detected at each sampling time point ST2. The same holds true for a period after time point 4 and before time point $t_5$.

Figure 10:
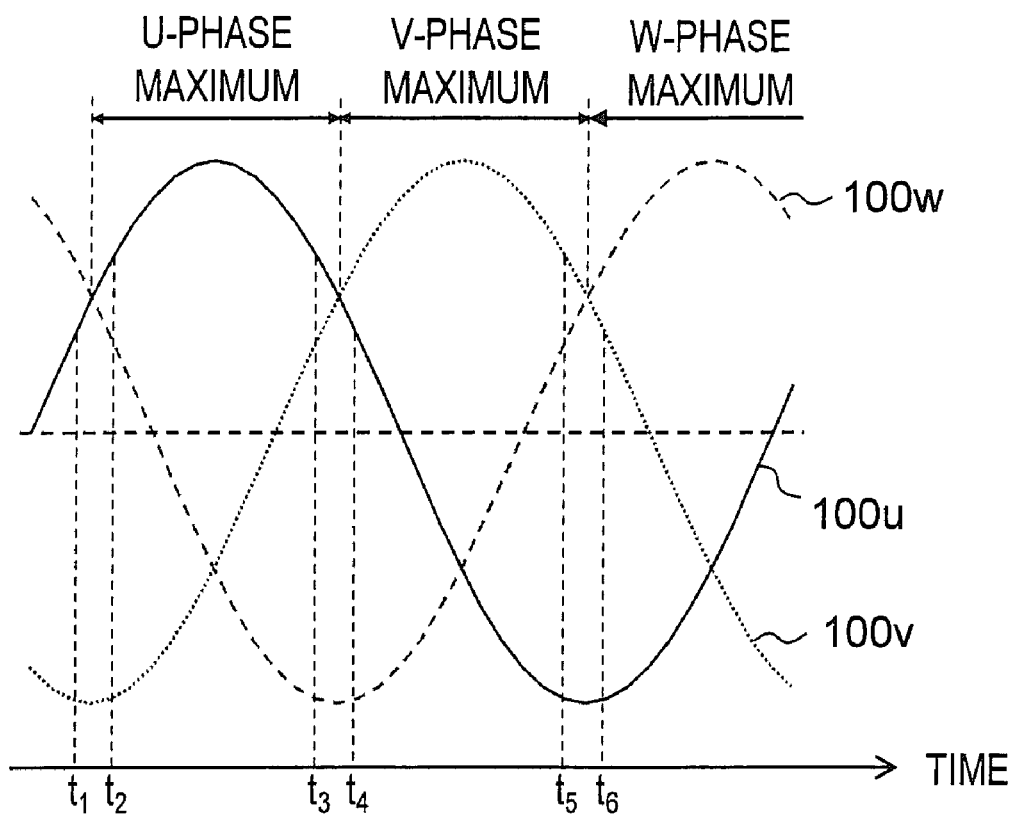
FIG. 10 is a diagram showing the three-phase alternating-current voltage applied to the motor shown in FIG. 1, illustrating the principles of a method of identifying a current undetectable period.

Now, as shown in FIG. 10, a time point immediately after the U-phase voltage is shifted from the intermediate phase to the maximum phase corresponds to time point $t_2$, and a time point immediately before the U-phase voltage is shifted from the maximum phase to the intermediate phase corresponds to time point $t_3$. In addition, suppose that a time point immediately after the V-phase voltage is shifted from the intermediate phase to the maximum phase corresponds to time point $t_4$, and a time point immediately before the V-phase voltage is shifted from the maximum phase to the intermediate phase corresponds to time point $t_5$. In this case, the U-phase current $i_u$ is detected as the bus current $I_{DC2}$ between time points $t_2$ and $t_3$, and the V-phase current $i_v$ is detected as the bus current $I_{DC2}$ between time points $t_4$ and $t_5$.

The bus current $I_{DC2}$ gradually increases immediately after time point $t_2$, and, at a time point almost midway between time points $t_2$ and $t_3$, the bus current $I_{DC2}$ takes a maximum value of 1.0. From that midway time point toward time point $t_3$, the bus current $I_{DC2}$ gradually decreases, and becomes approximately 0.6 immediately before time point $t_3$. At time point $t_3$ belonging to the current undetectable period, the bus current $I_{DC2}$ becomes zero. The reason is as follows. The sampling time point ST2 in a carrier period at time point $t_3$ belongs to a period between time points T3 and T4 shown in FIG. 8, and, in that period, the bus current $I_{DC2}$ becomes zero (see also FIG. 5D). The detected bus current $I_{DC2}$ is maintained at zero until time point $t_4$. The bus current $I_{DC2}$ that is zero at time point $t_4$ abruptly rises to approximately 0.6 immediately after time point $t_4$. The bus current $I_{DC2}$ changes between time points $t_4$ and $t_5$ in the same way that it changes between time points $t_2$ and $t_3$.

As a result of the bus current $I_{DC2}$ changing as described above, monitoring the current value of the bus current $I_{DC2}$ itself makes it possible to differentiate between a period during which a phase current of the maximum phase can be detected and a period during which a phase current of the maximum phase cannot be detected on the basis of the bus current $I_{DC2}$. In addition, since the bus current $I_{DC2}$ changes abruptly at time point $t_2$ or the like, it is also possible to differentiate between a period during which a phase current of the maximum phase can be detected and a period during which a phase current of the maximum phase cannot be detected by monitoring the first-order differential or second-order differential of the bus current $I_{DC2}$.

The same holds true for the bus current (hereinafter represented by $I_{DC1}$) detected at the sampling time point ST1 in each carrier period. The reason is as follows. At a time point almost midway between time points $t_2$ ad $t_3$, for example, it is impossible to detect a phase current of the minimum phase based on the bus current $I_{DC1}$ because the voltage levels of the V-phase voltage and the W-phase voltage are too close to each other, resulting in an abrupt change in the bus current $I_{DC1}$ in the vicinity of that time point. Therefore, by monitoring the current value of the bus current $I_{DC1}$ itself, or the first-order differential or second-order differential of the bus current $I_{DC1}$, it is possible to differentiate between a period during which a phase current of the minimum phase can be detected and a period during which a phase current of the minimum phase cannot be detected on the basis of the bus current $I_{DC1}$.

Incidentally, as is the case with the bus current $I_{DC2}$, the maximum value of the bus current $I_{DC1}$ is 1.0, and the bus current $I_{DC1}$ takes a value between 0 and 1.0.

Since the bus currents $I_{DC1}$ and $I_{DC2}$ are each a discrete value having a carrier period as a sampling period, the first-order differential and the second-order differential of the bus current $I_{DC1}$ can be obtained by calculating the first-order difference and the second-order difference of the bus current $I_{DC1}$, and the first-order differential and the second-order differential of the bus current $I_{DC2}$ can be obtained by calculating the first-order difference and the second-order difference of the bus current $I_{DC2}$.

Suppose that the carrier period appears in order the first, second, third, . . . , (n−1)-th, and n-th carrier period (wherein n is an integer that is equal to or greater than 3), and a value of the bus current $I_{DC1}$ detected at the sampling time point ST1 in the n-th carrier period is represented by $I_{DC1}[n]$. Then, a first-order difference value $D_{A1}[n]$ and a second-order difference value $D_{B1}[n]$ of the bus current $I_{DC1}$ with respect to the n-th carrier period are given by formulae (1) and (2) below.

$$D_{A1}[n] = I_{DC1}[n] - I_{DC1}[n-1] \quad (1)$$

$$D_{B1}[n] = (I_{DC1}[n] - I_{DC1}[n-1]) - (I_{DC1}[n-1] - I_{DC1}[n-2]) \quad (2)$$

Similarly, suppose that a value of the bus current $I_{DC2}$ detected at the sampling time point ST2 in the n-th carrier period is represented by $I_{DC2}[n]$. Then, a first-order difference value $D_{A2}[n]$ and a second-order difference value $D_{B2}[n]$ of the bus current $I_{DC2}$ with respect to the n-th carrier period are given by formulae (3) and (4) below.

$$D_{A2}[n] = I_{DC2}[n] - I_{DC2}[n-1] \quad (3)$$

$$DB2[n] = (I_{DC2}[n] - I_{DC2}[n-1]) - (I_{DC2}[n-1] - I_{DC2}[n-2]) \quad (4)$$

Since the current detectable period is a period during which both a phase current of the minimum phase and a phase current of the maximum phase can be detected, the controller 3 makes a judgment whether the present time belongs to the current detectable period or the current undetectable period based on the bus current $I_{DC1}$ and the bus current $I_{DC2}$. Processing for making this judgment is also referred to as "period judgment processing". Hereinafter, for convenience of description, the present time is assumed to be a time point in the n-th carrier period.

First Period Judgment Processing

In a case where period judgment processing is performed based on the values of the bus current $I_{DC1}$ and $I_{DC2}$ themselves, judgment is made whether the present time belongs to the current detectable period or the current undetectable period by comparing the values of the sequentially detected bus currents $I_{DC1}$ and $I_{DC2}$ with a predetermined determination threshold value $TH_D$. That is, if both of formulae (5a) and (5b) are satisfied, the present time is judged to belong to the current detectable period; otherwise, the present time is judged to belong to the current undetectable period. Period judgment processing based on formulae (5a) and (5b) is referred to as "first period judgment processing". Incidentally, arithmetic sign ">" can be replaced by "≧" in formulae (5a) and (5b).

$$I_{DC1}[n] > TH_D \quad (5a)$$

$$I_{DC2}[n] > TH_D \quad (5b)$$

The determination threshold value $TH_D$ is set to a value that is greater than 0. Preferably, the determination threshold value $TH_D$ is set based on a value that is equal to or smaller than one-half of the maximum value (1.0) of the bus current $I_{DC1}$ or $I_{DC2}$. That is, it is preferable that $TH_D \leq 0.5$.

Figure 11:
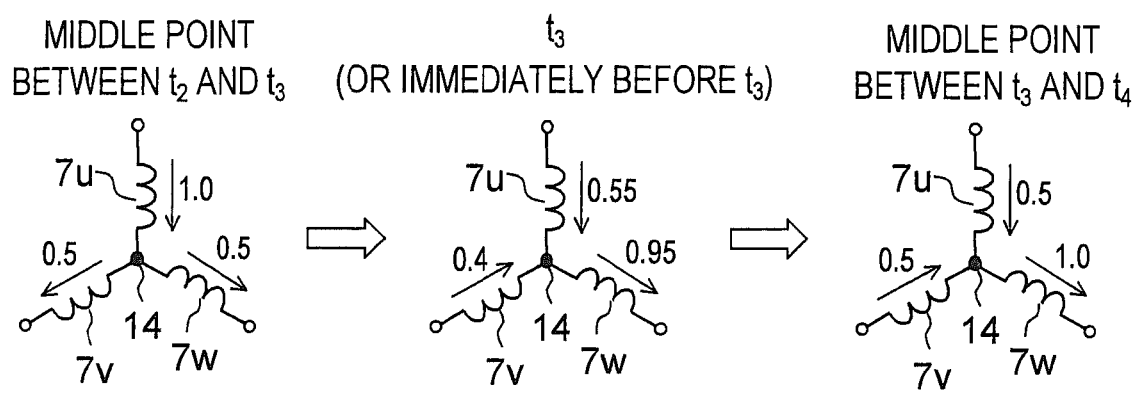
FIG. 11 is a diagram showing a state of a current flowing through the armature winding shown in FIG. 1 at each time point.

The reason why $TH_D \leq 0.5$ will be described with reference to FIG. 11. FIG. 11 shows a current state in the vicinity of time point $t_3$ shown in FIG. 10. As described above, the polarity of a current flowing into the neutral point 14 is assumed to be positive, and the polarity of a current flowing from the neutral point 14 is assumed to be negative. At a middle point between time points $t_2$ and $t_3$, $i_u$, $i_v$, and $i_w$ are 1.0, −0.5, and −0.5, respectively. Thereafter, toward time point $t_3$, $i_u$ gradually changes from 1.0 to 0.5, and $i_w$ gradually changes from −0.5 to −1.0. In addition, toward time point $t_3$, $i_v$ gradually changes from −0.5 to 0.5. At a middle point between time points $t_3$ and $t_4$, $i_u$, $i_v$, and $i_w$ are 0.5, 0.5, and −1.0, respectively. At a middle point between time points $t_3$ and $t_4$, the voltage levels of the U-phase voltage and the V-phase voltage become identical to each other, making it impossible to detect a phase current based on the bus current $I_{DC2}$. Also at time point $t_3$, the difference between the voltage levels of the U-phase voltage and the V-phase voltage is too small, making it impossible to detect the U-phase current of the maximum phase based on the bus current $I_{DC2}$. As a result, the bus current $I_{DC2}$ detected at time point $t_3$ is zero due to the presence of time $T_A$ (see FIG. 8). On the other hand, the bus current $I_{DC2}$ detected immediately before time point $t_3$ is between 1.0 and 0.5 and is closer to 0.5.

As described above, if the bus current $I_{DC2}$ represents a phase current of the maximum phase, the bus current $I_{DC2}$ should be 0.5 or greater; if a phase current of the maximum phase cannot be detected based on the bus current $I_{DC2}$, the bus current $I_{DC2}$ is zero (or approximately zero). Thus, the determination threshold value $TH_D$ should be set to be equal to or smaller than 0.5. By setting the determination threshold value $TH_D$ as described above, it is possible to make a satisfactory judgment whether the present time belongs to the current detectable period or the current undetectable period. For example, $TH_D$ is set to 0.3 with consideration given to a margin.

Second Period Judgment Processing

In a case where period judgment processing is performed based on the first-order difference values of the bus currents $I_{DC1}$ and $I_{DC2}$, it is judged whether the present time belongs to the current detectable period or the current undetectable period by comparing the first-order difference values of the bus currents $I_{DC1}$ and $I_{DC2}$ with a predetermined determination threshold value $TH_F$. Period judgment processing based on the first-order difference value is referred to as "second period judgment processing". Second period judgment processing (and third period judgment processing, which will be described below) will be described in detail in Example 1, which will be described later.

Third Period Judgment Processing

In a case where period judgment processing is performed based on the second-order difference values of the bus currents $I_{DC1}$ and $I_{DC2}$, it is judged whether the present time belongs to the current detectable period or the current undetectable period by comparing the second-order difference values of the bus currents $I_{DC1}$ and $I_{DC2}$ with a predetermined determination threshold value $TH_F$. Period judgment processing based on the second-order difference value is referred to as "third period judgment processing".

As an example to which the above-described period judgment processing is applied, Examples 1 to 4 will be described below. Any feature of one Example (Example 1, in particular) can be applied, unless inconsistent, to other Examples.

Example 1

Figure 12:
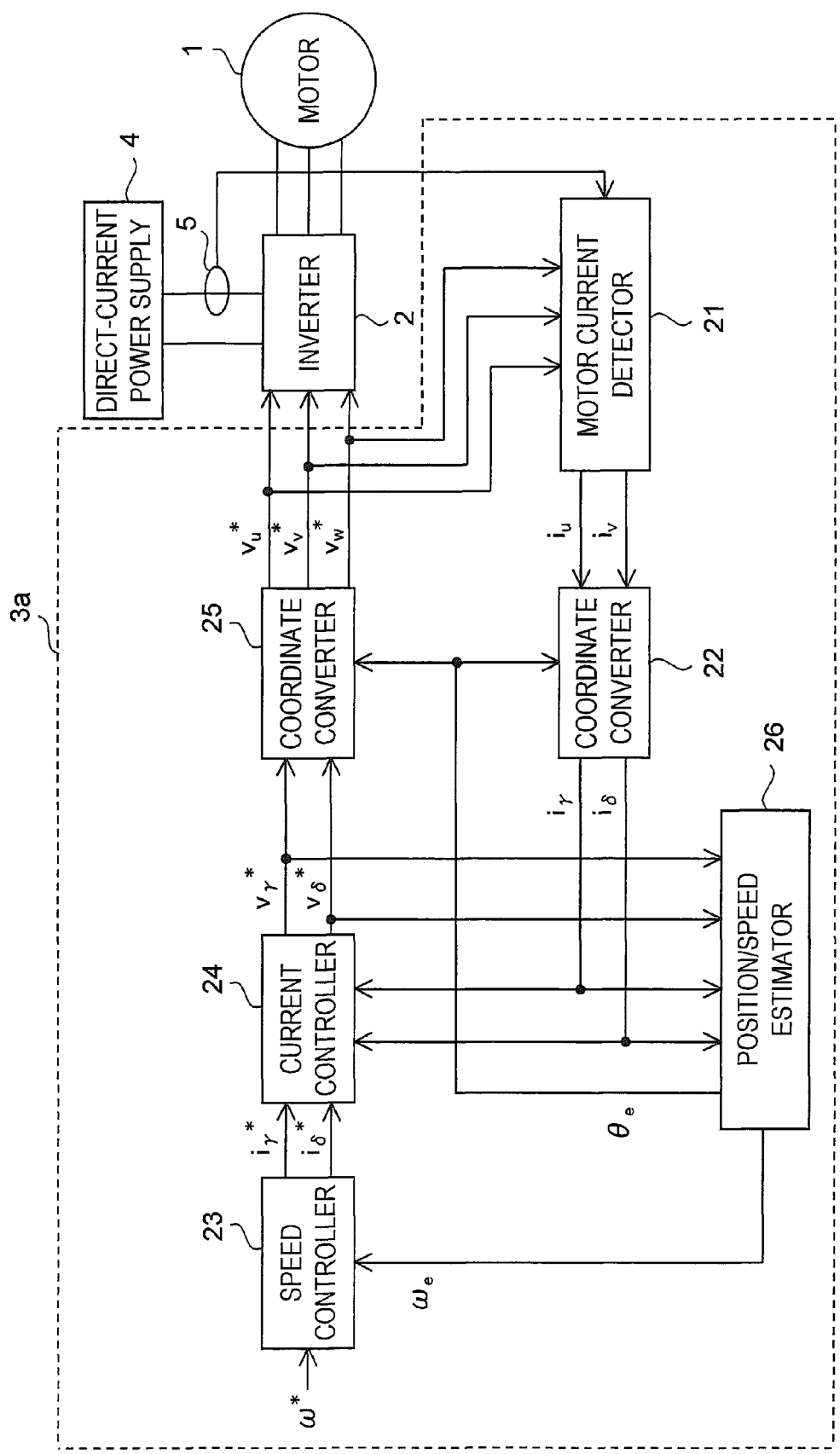
FIG. 12 is a detailed block diagram of a motor drive system according to Example 1 of the invention.

First, Example 1 will be described. FIG. 12 is a block diagram of a motor drive system according to Example 1. The motor drive system shown in FIG. 12 includes a controller 3a, in addition to the motor 1, the inverter 2, the direct-current power supply 4, and the current sensor 5, which have been shown in FIG. 1. The controller 3a is a specific example of the controller 3 shown in FIG. 1, and realizes the functions of the controller 3. The controller 3a includes different parts represented by reference numerals 21 to 26. The different parts constituting the motor drive system can freely use all the values produced within the motor drive system as necessary.

Figure 13:
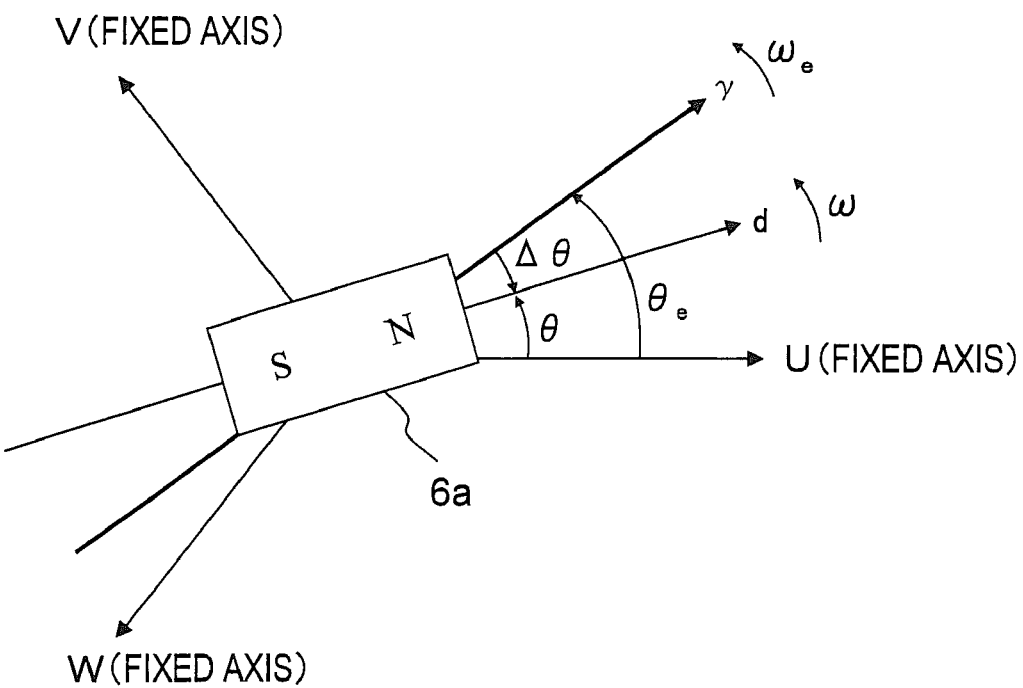
FIG. 13 is an analysis model diagram of the motor shown in FIG. 12.

Before presenting a detailed description of the different parts of the motor drive system shown in FIG. 12, different state quantities (state parameters) will be described and defined. FIG. 13 is an analysis model diagram of the motor 1. FIG. 13 shows the U-phase, V-phase, and W-phase armature winding fixed axes. Reference character 6a represents the permanent magnet provided on the rotor 6 (see FIG. 1) of the motor 1. In a rotating coordinate system that rotates at the same speed as the magnetic flux produced by the permanent magnet 6a, the direction of the magnetic flux produced by the permanent magnet 6a is referred to as the d-axis. Though not illustrated, the axis having a phase leading the d-axis by an electrical angle of 90 degrees is referred to as the q-axis.

In the motor drive system, an axis for control purposes, the axis corresponding to the d-axis, is referred to as the γ-axis, and an axis for control purposes, the axis corresponding to the q-axis, is referred to as the δ-axis. In a case where a position sensor for detecting the rotor position is not used when performing vector control of the motor 1, the γ-axis and the δ-axis are each estimated as the axis estimated for control purposes. The δ-axis is an axis that leads the γ-axis by an electrical angle of 90 degrees (not shown in FIG. 13). In general, vector control is performed such that the γ-axis and the δ-axis are made identical to the d-axis and the q-axis. The d-axis and the q-axis are coordinate axes of the rotating coordinate system having the real axes, and the coordinates having the d-q axes as their coordinate axes are referred to as the d-q coordinates. The γ-axis and the δ-axis are coordinate axes of the rotating coordinate system for control purposes, and the coordinates having the γ-δ axes as their coordinate axes are referred to as the γ-δ coordinates.

The d-axis (and the q-axis) rotates, and its rotation speed is represented by ω. The γ-axis (and the δ-axis) also rotates, and its rotation speed is represented by $\omega_e$. The rotation speed represented by ω or $\omega_e$ is the rotation speed at electrical angle. With respect to the d–q coordinates, the phase of the d-axis is represented, relative to the U-phase armature winding fixed axis, by θ. Likewise, with respect to the γ-δ coordinates, the phase of the γ-axis is represented, relative to the U-phase armature winding fixed axis, by $\theta_e$. Then, the axis error Δθ between the d- and γ-axes is given by $\Delta\theta = \theta - \theta_e$. The phase of the d-axis and the γ-axis, relative to the U-phase armature winding fixed axis, is referred to as a rotor position.

The whole of the motor voltage applied to the motor 1 from the inverter 2 is referred to as the motor voltage $V_a$, and the whole of the motor current supplied to the motor 1 from the inverter 2 is referred to as the motor current $I_a$. The γ-axis component and the δ-axis component of the motor voltage $V_a$ are referred to as the γ-axis voltage $v_\gamma$ and the δ-axis voltage $v_\delta$ respectively, and the γ-axis component and the δ-axis component of the motor current $I_a$ are referred to as the γ-axis current $i_\gamma$ and the δ-axis current $i_\delta$ respectively.

The values (specified voltage values) specifying the γ-axis voltage $v_\gamma$ and the δ-axis voltage $v_\delta$ are referred to as the specified γ-axis voltage value $v_\gamma^*$ and the specified δ-axis voltage value $v_\delta^*$, respectively. Here, $v_\gamma^*$ and $v_\delta^*$ represent the voltages (voltage values) to be followed by $v_\gamma$ and $v_\delta$, respectively.

The values (specified current values) specifying the γ-axis current $i_γ$ and the δ-axis current $i_δ$ are referred to as the specified γ-axis current value $i_γ^*$ and the specified δ-axis current value $i_δ^*$, respectively. Here, $i_γ^*$ and $i_δ^*$ represent the currents (current values) to be followed by the $i_γ$ and $i_δ$, respectively.

Operation of the different parts of the motor drive system shown in FIG. 12 will be described. The motor current detector 21 detects the bus currents $I_{DC1}$ and $I_{DC2}$ by identifying the sampling time points ST1 and ST2 based on the specified three-phase voltage values ($v_u^*$, $v_v^*$, and $v_w^*$) outputted from the coordinate converter 25, and sampling an analog output signal from the current sensor 5 at the sampling time points ST1 and ST2 and performing A/D conversion on them.

The motor current detector 21 performs the above-described period judgment processing based on the bus currents $I_{DC1}$ and $I_{DC2}$ that are sequentially fed thereto. That is, the motor current detector 21 makes a judgment whether the present time belongs to the current detectable period or the current undetectable period. If the present time is judged to belong to the current detectable period, the motor current detector 21 identifies to which of the first to sixth modes the present time belongs based on the specified three-phase voltage values (see FIG. 6), and calculates the U-phase current $i_u$ and the V-phase current $i_v$ based on the mode thus identified and the currently detected bus current $I_{DC1}$ and $I_{DC2}$. The calculated values are outputted to the coordinate converter 22. In so doing, the motor current detector 21 exploits, if necessary, the fact that the total sum of the U-phase current $i_u$, the V-phase current $i_v$, and the W-phase current $i_w$ is zero. A method of period judgment processing according to this example and operation performed by the controller 3a when the present time is judged to belong to the current undetectable period will be described later. First, operation of the different parts of the controller 3a will be described.

By performing coordinate conversion so that the U-phase current $i_u$ and the V-phase current $i_v$ are converted into those on the γ-δ axes based on the rotor position $θ_e$ fed from the position/speed estimator 26 (hereinafter referred to simply as the "estimator 26"), the coordinate converter 22 calculates the γ-axis current $i_γ$ and the δ-axis current $i_δ$, and outputs them.

By referring to a specified rotation speed $ω^*$ fed from a specified rotation speed value producing portion (unillustrated) provided inside or outside the controller 3a, and the rotation speed $ω_e$ fed from the estimator 26, and by performing, for example, proportional-plus-integral control, the speed controller 23 calculates the specified γ-axis current value $i_γ^*$ and the specified δ-axis current value $i_δ^*$ such that the speed error ($ω^*-ω_e$) is made to converge to zero, and outputs them.

By referring to $i_γ^*$ and $i_δ^*$ calculated by the speed controller 23 and $i_γ$ and $i_δ$ outputted from the coordinate converter 22, and by performing, for example, proportional-plus-integral control, the current controller 24 calculates the specified γ-axis voltage value $v_γ^*$ and the specified δ-axis voltage value $v_δ^*$ such that the current errors ($i_γ^*-i_γ$) and ($i_δ^*-i_δ$) are made to converge to zero, and outputs them.

By performing coordinate conversion so that $v_γ^*$ and $v_δ^*$ fed from the current controller 24 are converted into those on the three-phase fixed coordinate axes based on the rotor position $θ_e$ outputted from the estimator 26, the coordinate converter 25 calculates the specified three-phase voltage values ($v_u^*$, $v_v^*$, and $v_w^*$), and outputs them.

The estimator 26 estimates the rotation speed $ω_e$ such that the axis error $Δθ$ (see FIG. 13) between the d- and γ-axes is made to converge to zero by performing, for example, proportional-plus-integral control by using all or part of $i_γ$ and $i_δ$ outputted from the coordinate converter 22 and $v_γ^*$ and $v_δ^*$ outputted from the current controller 24, and estimates the rotor position $θ_e$ by integrating the rotation speed $ω_e$ thus estimated. There have conventionally been proposed various methods for estimating the rotor position $θ_e$ and the rotation speed $ω_e$, and any method heretofore known can be adopted in the estimator 26. For example, a method that is disclosed in JP-A-2007-53829, which the applicant of the present invention once proposed, may be adopted. The rotor position $θ_e$ estimated by the estimator 26 is outputted to the coordinate converters 22 and 25, and the rotation speed $ω_e$ estimated by the estimator 26 is outputted to the speed controller 23.

The inverter 2 controls the switching of each arm provided in the inverter 2 in accordance with the specified three-phase voltage values outputted from the coordinate converter 25, and thereby supplies the motor current $I_a$ commensurate with the specified values (such as $i_γ^*$ and $i_δ^*$) produced in the controller 3a to the motor 1 to drive it.

Operation Flow Chart

Figure 14:
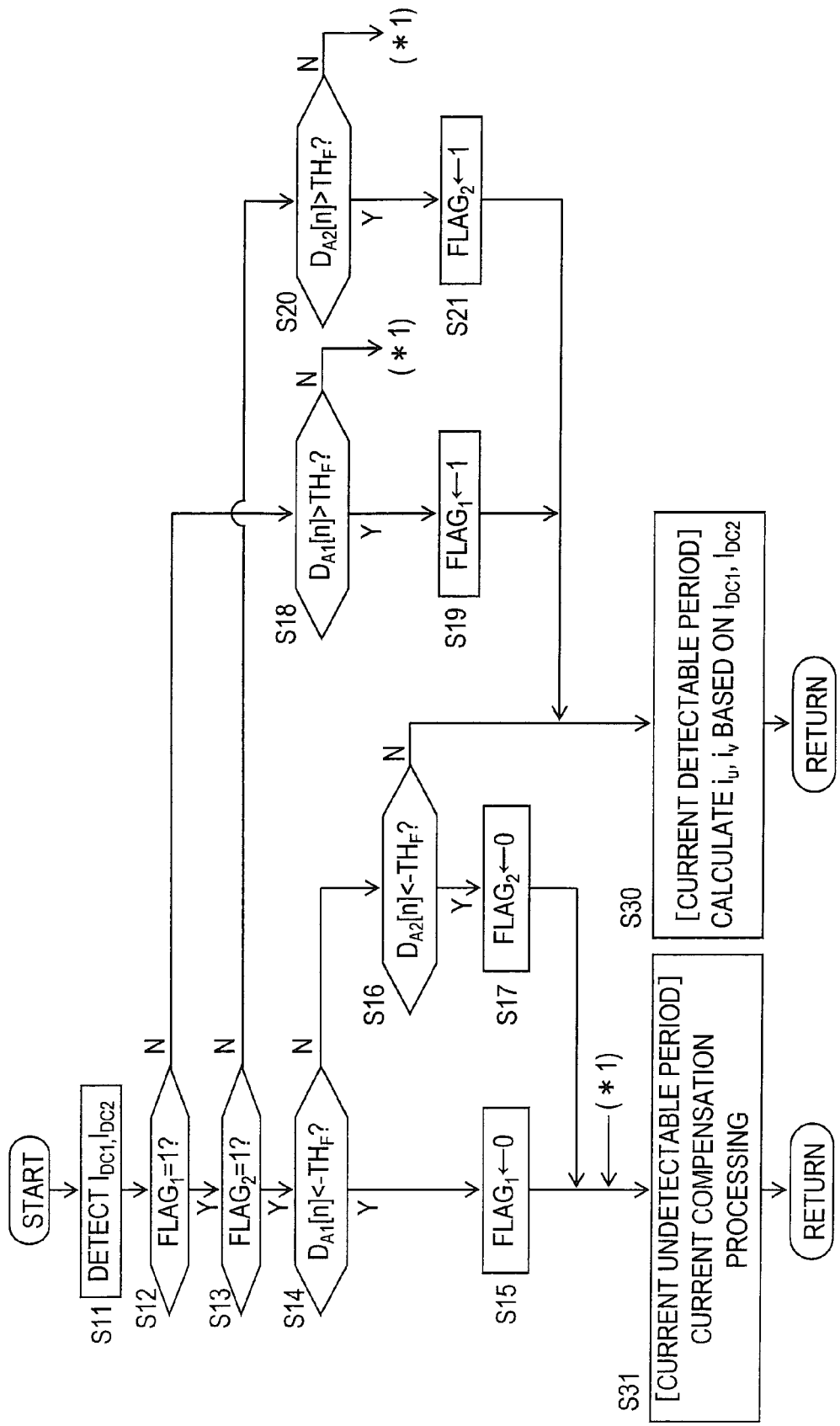
FIG. 14 is a flow chart illustrating operation of the controller shown in FIG. 12.
Figure 15:
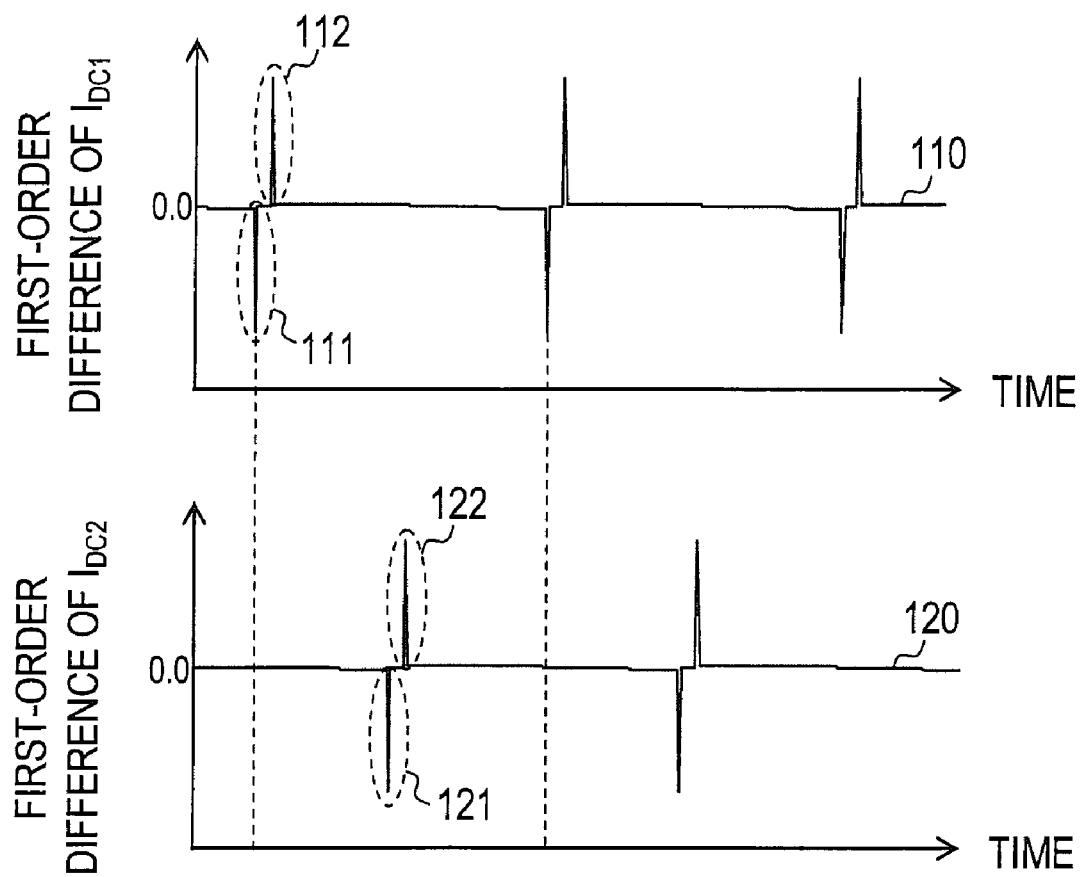
FIG. 15 is a diagram showing how the first-order difference value of the bus current ($I_{DC1}$) corresponding to the minimum phase and the first-order difference value of the bus current ($I_{DC2}$) corresponding to the maximum phase vary with time.

With reference to FIG. 14, a method of period judgment processing and operation performed by the controller 3a according to the processing results will be described. FIG. 14 is a flow chart illustrating operation of the controller 3a shown in FIG. 12, with emphasis placed on the period judgment processing. FIG. 14 is a flow chart illustrating operation performed when the second period judgment processing using the first-order difference value is adopted. A description will be given with reference to FIG. 15 in addition to FIG. 14. In FIG. 15, a waveform 110 indicates how the first-order difference value of the bus current $I_{DC1}$ varies with time, and a waveform 120 indicates how the first-order difference value of the bus current $I_{DC2}$ varies with time. The first-order difference value of the bus current $I_{DC1}$ varies greatly in a time region in which the voltage levels of a phase voltage of the minimum phase and a phase voltage of the intermediate phase come close to each other, and the first-order difference value of the bus current $I_{DC2}$ varies greatly in a time region in which the voltage levels of a phase voltage of the maximum phase and a phase voltage of the intermediate phase come close to each other.

The procedures in steps S11 to S21 and S30 shown in FIG. 14 are performed by the motor current detector 21 shown in FIG. 12. Current compensation processing performed in step S31 is performed by the motor current detector 21 or by the controller 3a as a whole including the motor current detector 21. Loop processing composed of steps S11 to S21 and steps S30 and S31 is performed once each carrier period.

The motor current detector 21 adopts $FLAG_1$ as a flag indicating whether or not a phase current of the minimum phase can be detected based on the bus current $I_{DC1}$, and adopts $FLAG_2$ as a flag indicating whether or not a phase current of the maximum phase can be detected based on the bus current $I_{DC2}$. Flag "1" indicates "detectable", and flag "0" indicates "undetectable".

Suppose that an initial value "1" is substituted into $FLAG_1$ and $FLAG_2$ in a current detectable period. Thereafter, the procedure proceeds to step S11 every time a new carrier period starts. In step S11, the bus currents $I_{DC1}$ and $I_{DC2}$ are detected with the current sensor 5. Then, in step S12, the state of $FLAG_1$ is checked. If $FLAG_1=1$, the procedure proceeds to step S13. On the other hand, if $FLAG_1=0$, the procedure proceeds to step S18. In step S13, the state of $FLAG_2$ is checked. If $FLAG_2=1$, the procedure proceeds to step S14. On the other hand, if $FLAG_2=0$, the procedure proceeds to step S20.

As described above, the present time is assumed to be a time point in the n-th carrier period. If the (n-1)-th carrier period belongs to the current detectable period, both $FLAG_1$ and $FLAG_2$ indicate "1". Thus, the procedure proceeds to step S14. In step S14, it is judged whether or not the bus current $I_{DC1}$ decreases abruptly. Doing so is the equivalent of judging whether or not a negative spike 111 shown in FIG. 15 is detected. In actuality, in step S14, it is judged whether or not formula (6a) below is satisfied (note that, as described earlier, $I_{DC1}[n]$ represents a value of the bus current $I_{DC1}$ in the n-th carrier period). Here, although a determination threshold value $TH_F$ is assumed to be a predetermined positive value, as can be understood from the description given with reference to FIG. 11, it is preferable that the determination threshold value $TH_F$ be set such that $TH_F \leq 0.5$ holds. For example, $TH_F$ is set to 0.3 with consideration given to a margin. Incidentally, arithmetic sign "<" can be replaced by "≦" in formula (6a).

$$D_{A1}[n]=I_{DC1}[n]-I_{DC1}[n-1]<-TH_F \qquad (6a)$$

If formula (6a) is found to be satisfied in step S14, the procedure proceeds to step S15; if formula (6a) is found not to be satisfied, the procedure proceeds to step S16. After the negative spike 111 shown in FIG. 15 is detected, a phase current of the minimum phase cannot be detected based on the bus current $I_{DC1}$ until the time when a positive spike 112 is detected. As a result, after "0" is substituted into $FLAG_1$ in step S15, the procedure proceeds to step S31.

If the procedure proceeds to step S31, the motor current detector 21 shown in FIG. 12 judges that the present time belongs to the current undetectable period, and performs processing for compensating for a current undetectable state. This processing is referred to as current compensation processing. Current compensation processing will be described later. After current compensation processing is performed in step S31, the procedure goes back to step S11 when the next carrier period starts.

In step S16, it is judged whether or not the bus current $I_{DC2}$ decreases abruptly. Doing so is the equivalent of judging whether or not a negative spike 121 shown in FIG. 15 is detected. In actuality, in step S16, it is judged whether or not formula (6b) below is satisfied. Incidentally, arithmetic sign "<" can be replaced by "≦" in formula (6b).

$$D_{A2}[n]=I_{DC2}[n]-I_{DC2}[n-1]<-TH_F \qquad (6b)$$

If formula (6b) is found to be satisfied in step S16, the procedure proceeds to step S17; if formula (6b) is found not to be satisfied, the procedure proceeds to step S30. After the negative spike 121 shown in FIG. 15 is detected, a phase current of the maximum phase cannot be detected based on the bus current $I_{DC2}$ until the time when a positive spike 122 is detected. As a result, after "0" is substituted into $FLAG_2$ in step S17, the procedure proceeds to step S31, and processing in step S31 is performed.

If the procedure proceeds to step S30, judging that the present time belongs to the current detectable period, the motor current detector 21 shown in FIG. 12 calculates the U-phase current $i_u$ and the V-phase current $i_v$ based on the bus currents $I_{DC1}$ and $I_{DC2}$ detected in the latest step S11, and sends the currents thus calculated to the coordinate converter 22. Thereafter, the different parts of the controller 3a operate based on $i_u$ and $i_v$ thus calculated. That is, in the current detectable period, vector control of the motor 1 is performed based on the bus currents $I_{DC1}$ and $I_{DC2}$. After the procedure proceeds to step S30 and necessary processing is performed, the procedure goes back to step S11 when the next carrier period starts.

If $FLAG_1$ indicates "0" due to the negative spike 111 (see FIG. 15) detected in the past, the procedure proceeds from step S12 to step S18. In step S18, it is judged whether or not the bus current $I_{DC1}$ increases abruptly. Doing so is the equivalent of judging whether or not the positive spike 112 shown in FIG. 15 is detected. In actuality, in step S18, it is judged whether or not formula (7a) below is satisfied. Incidentally, arithmetic sign ">" can be replaced by "≧" in formula (7a).

$$D_{A1}[n]=I_{DC1}[n]-I_{DC1}[n-1]>TH_F \qquad (7a)$$

If formula (7a) is found to be satisfied in step S18, the current undetectable period is considered to be shifted into the current detectable period. Thus, the procedure proceeds to step S19, and "1" is substituted into $FLAG_1$. Then, the procedure proceeds to step S30, and processing in step S30 is performed. On the other hand, if formula (7a) is found not to be satisfied in step S18, the present time is considered to still belong to the current undetectable period. Thus, the procedure proceeds to step S31, and processing in step S31 is performed.

If $FLAG_2$ indicates "0" due to the negative spike 121 (see FIG. 15) detected in the past, the procedure proceeds from step S13 to step S20. In step 20, it is judged whether or not the bus current $I_{DC2}$ increases abruptly. Doing so is the equivalent of judging whether or not the positive spike 122 shown in FIG. 15 is detected. In actuality, in step S20, it is judged whether or not formula (7b) below is satisfied. Incidentally, arithmetic sign ">" can be replaced by ">" in formula (7b).

$$D_{A2}[n]=I_{DC2}[n]-I_{DC2}[n-1]>TH_F \qquad (7b)$$

If formula (7b) is found to be satisfied in step S20, the current undetectable period is considered to be shifted into the current detectable period. Thus, the procedure proceeds to step S21, and "1" is substituted into $FLAG_2$. Then, the procedure proceeds to step S30, and processing in step S30 is performed. On the other hand, if formula (7b) is found not to be satisfied in step S20, the present time is considered to still belong to the current undetectable period. Thus, the procedure proceeds to step S31, and processing in step S31 is performed.

The descriptions heretofore deal with the flow of operation performed when the second period judgment processing using the first-order difference value of the bus current is adopted. However, it is also possible to use, instead of the second period judgment processing, the first period judgment processing based on the value of the bus current itself. In a case where the first period judgment processing is used, the bus currents $I_{DC1}$ and $I_{DC2}$ are detected in each carrier period, and it is judged whether or not formulae (5a) and (5b) above are satisfied. If both formulae (5a) and (5b) are found to be satisfied, processing in step S30 is performed; otherwise, processing in step S31 is performed.

Alternatively, it is also possible to use, instead of the second period judgment processing, the third period judgment processing based on the second-order difference value of the bus current. As can be understood from FIGS. 9A, 9B, and 9C, when the transition from the current detectable period to the current undetectable period occurs, a negative spike is observed not only in the first-order difference value but also in the second-order difference value; when the transition from the current undetectable period to the current detectable period occurs, a positive spike is observed not only in the first-order difference value but also in the second-order difference value. Thus, the flow of operation performed when the third period judgment processing is used is similar to that shown in FIG. 14. However, in a case where the third period judgment processing is used, the first-order difference values $D_{A1}[n]$ and $D_{A2}[n]$ are replaced by the second-order difference values $D_{B1}[n]$ and $D_{B2}[n]$, respectively, in steps S14, S16, S18, and S20.

Current Compensation Processing

Current compensation processing performed in step S31 in FIG. 14 will be described. With current compensation processing, the present $i_u$ and $i_v$ are calculated based on $i_u$ and $i_v$ detected in the past, for example. For example, in a case where the (n−1)-th carrier period is found to belong to the current detectable period, and the n-th to (n+6)-th carrier periods are found to belong to the current undetectable period, the U-phase current $i_u$ and the V-phase current $i_v$ based on the bus currents $I_{DC1}$ and $I_{DC2}$ detected in the (n−1)-th carrier period are fed to the coordinate converter 22 as the U-phase current $i_u$ and the V-phase current $i_v$ in the n-th to (n+6)-th carrier periods.

Instead, for example, current compensation processing disclosed in JP-A-2004-64903 may be used. That is, for example, in a case where the present time belongs to the current undetectable period, the γ-axis current $i_\gamma$ and the δ-axis current $i_\delta$, which are obtained by performing coordinate conversion on the U-phase current $i_u$ and the V-phase current $i_v$ detected in the past, are subjected to reverse conversion by using the rotor position $\theta_e$ to obtain the U-phase current $i_u$ and the V-phase current $i_v$, and the U-phase current $i_u$ and the V-phase current $i_v$ thus obtained are used as the U-phase current $i_u$ and the V-phase current $i_v$ at the present time to perform vector control of the motor 1.

Figure 16:
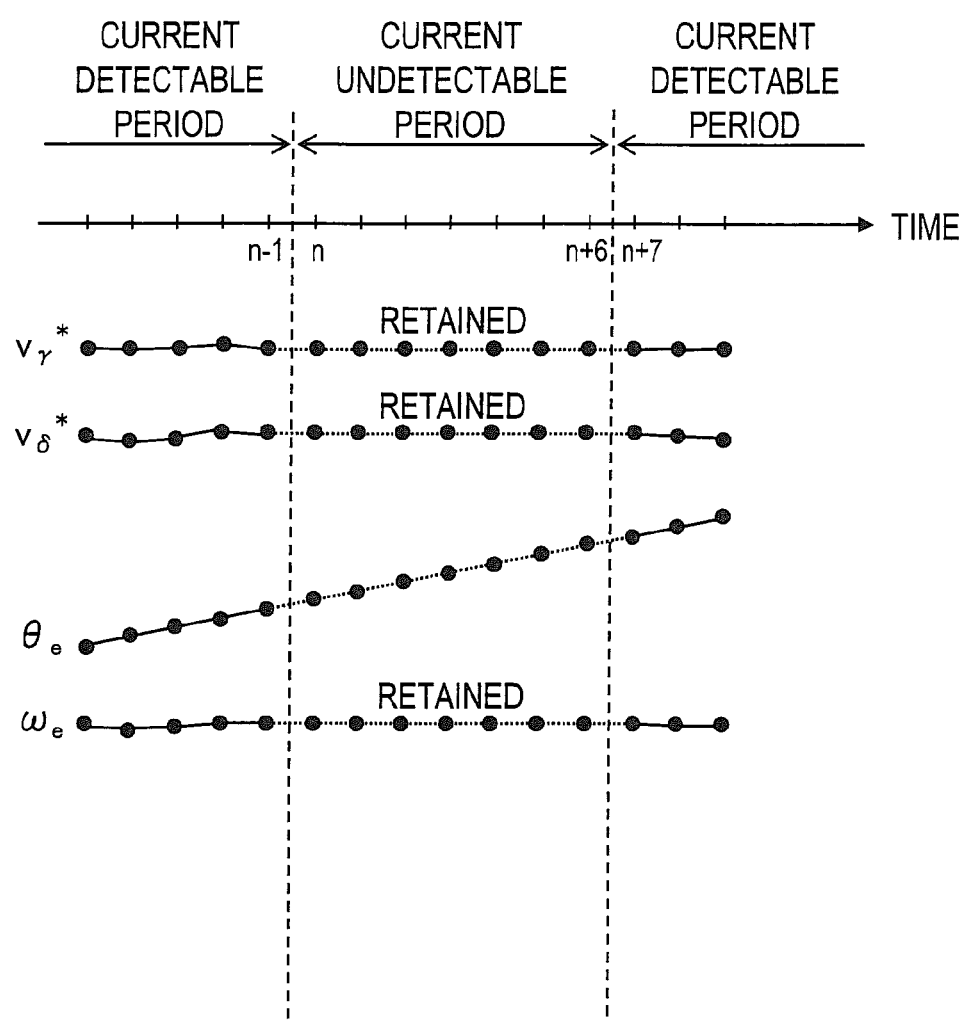
FIG. 16 is a diagram illustrating an example of current compensation processing performed in step S31 of FIG. 14.

Instead, for example, a specified voltage value may be retained in the current detectable period, such that the specified voltage value thus retained is used in the current undetectable period. The method using retention of specified voltage value is one of the methods of realizing current compensation processing. With reference to FIG. 16, the method using retention of specified voltage value will be described. Suppose that the (n−1)-th carrier period is found to belong to the current detectable period, the n-th to (n+6)-th carrier periods are found to belong to the current undetectable period, and the (n+7)-th carrier period is found to belong to the current detectable period. In addition, $v_\gamma^*$ and $v_\delta^*$ corresponding to the n-th carrier period are represented by $v_\gamma^*[n]$ and $v_\delta^*[n]$, respectively, and $\theta_e$ and $\omega_e$ corresponding to the n-th carrier period are represented by $\theta_e[n]$ and $\omega_e[n]$, respectively.

In this case, the U-phase current $i_u$ and the V-phase current $i_v$ are obtained based on the bus currents $I_{DC1}$ and $I_{DC2}$ detected in the (n−1)-th carrier period, and, based on the U-phase current $i_u$ and the V-phase current $i_v$ thus obtained, $\theta_e[n-1]$ and $\omega_e[n-1]$, and $v_\gamma^*[n-1]$ and $v_\delta^*[n-1]$ are calculated through processing performed by the coordinate converter 22, the speed controller 23, the current controller 24, and the estimator 26. Then, $v_\gamma^*[n-1]$ and $v_\delta^*[n-1]$ thus calculated are fed to the coordinate converter 25 as $v_\gamma^*$ and $v_\delta^*$ corresponding to the (n−1)-th carrier period.

In the n-th to (n+6)-th carrier periods, calculation of $i_u$, $i_v$, $i_\gamma$, and $i_\delta$ are stopped, and $v_\gamma^*[n-1]$ and $v_\delta^*[n-1]$ are fed to the coordinate converter 25 as $v_\gamma^*$ and $v_\delta^*$. In the (n+7)-th carrier period, the U-phase current $i_u$ and the V-phase current $i_v$ are obtained based on the bus currents $I_{DC1}$ and $I_{DC2}$, and, based on the U-phase current $i_u$ and the V-phase current $i_v$ thus obtained, $v_\gamma^*[n+7]$ and $v_\delta^*[n+7]$ are calculated through processing by the coordinate converter 22, the speed controller 23, the current controller 24, and the estimator 26. Then, $v_\gamma^*[n+7]$ and $v_\delta^*[n+7]$ thus calculated are fed to the coordinate converter 25 as $v_\gamma^*$ and $v_\delta^*$ corresponding to the (n+7)-th carrier period.

In the n-th to (n+6)-th carrier periods, the estimator 26 temporarily stops estimating $\theta_e$ and $\omega_e$ based on $i_\gamma$ and $i_\delta$. Instead, on the presumption that the rotor 6 keeps rotating at a rotation speed of $\omega_e[n-1]$ in the current undetectable period, the estimator 26 estimates $\theta_e$ (that is, $\theta_e[n]$ to $\theta_e[n+6]$) in the current undetectable period relative to $\theta_e[n-1]$. Thus, $\omega_e$ (that is, $\omega_e[n]$ to $\omega_e[n+6]$) in the current undetectable period is regarded as the same as $\omega_e[n-1]$. Since the rotor keeps rotating at roughly a constant rate in a steady state, estimating $\theta_e$ and $\omega_e$ in the current undetectable period in the above-described manner presents little problem.

A method of retaining $v_\gamma^*$ and $v_\delta^*$ in the current undetectable period so as to control the motor 1 based on $v_\gamma^*$ and $v_\delta^*$ thus retained is one of the methods of controlling the motor 1 based on the bus current detected in the current detectable period. The reason is that $v_\gamma^*[n-1]$ and $v_\delta^*[n-1]$ used as $v_\gamma^*$ and $v_\delta^*$ in the current undetectable period are obtained based on the bus current detected in the current detectable period.

Actual Current Waveform

Figure 17A:
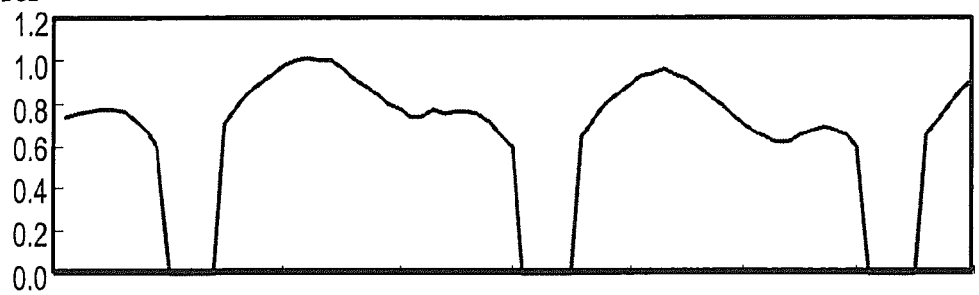
FIG. 17A is a diagram showing how the actually detected bus current varies with time.
Figure 17B:
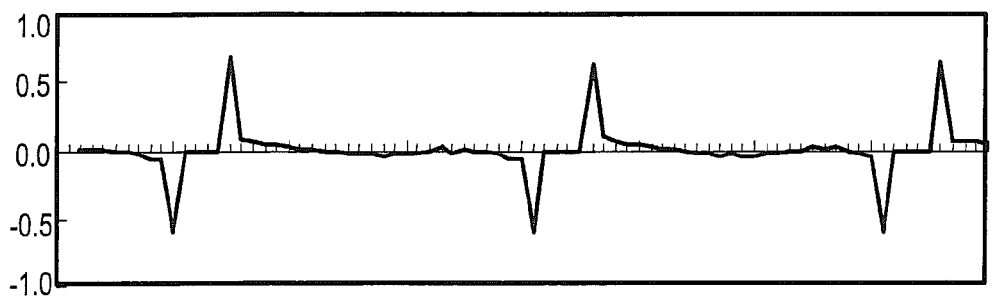
FIG. 17B is a diagram showing how the first-order difference value of the actually detected bus current varies with time.
Figure 17C:
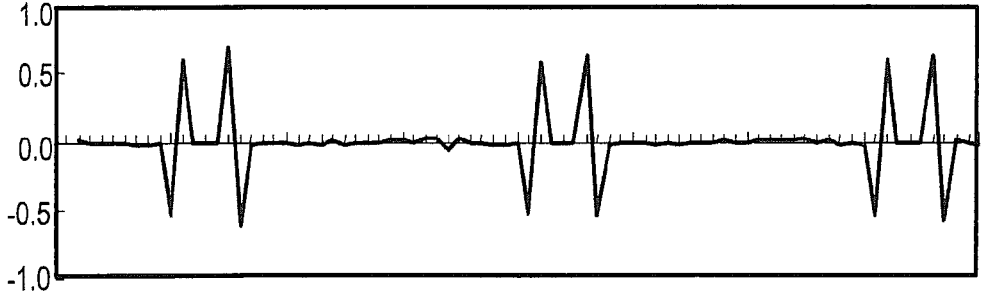
FIG. 17C is a diagram showing how the second-order difference value of the actually detected bus current varies with time.

FIGS. 17A, 17B, and 17C show the actual measurement results of current corresponding to the simulation results shown in FIGS. 9A, 9B, and 9C, respectively. FIG. 17A shows how the actually measured bus current $I_{DC2}$ varies with time. FIG. 17B shows how the first-order difference value of the actually measured bus current $I_{DC2}$ varies with time. FIG. 17C shows how the second-order difference value of the actually measured bus current $I_{DC2}$ varies with time.

Unlike the ideal state corresponding to FIG. 9A or the like, in actuality, the current waveform of the bus current is distorted due to, for example, an error between a motor parameter used for vector control and a true value or an error in estimating the rotor position. However, it is possible to judge whether or not an arbitrary time point is in the current undetectable period by the above-described method.

Conventionally, there has been a current undetectable period judging method by setting a voltage threshold value for a difference between two phase voltages, and comparing the difference between two phase voltages with the voltage threshold value. However, with this conventional method, since the voltage threshold value has to be set with allowance made for various factors, there is a possibility that, although in actuality two phase currents can be detected, it is judged that they cannot be detected. That is, with this conventional method, it is impossible to make the most of the interval during which two phase currents can be detected. In addition, since an optimum voltage threshold value varies depending on the drive conditions of the motor, different voltage threshold values have to be set previously one for each of the drive conditions so as to support various drive conditions. This undesirably requires much time and labor in performing design.

By contrast, according to this example (Example 1), it is possible to judge in real time whether or not an arbitrary time point is in the current undetectable period based on the actually detected bus current. This makes it possible to make the most of the interval during which two phase currents can be detected. As a result, the motor 1 is controlled with a higher degree of accuracy. In addition, there is no need to obtain a voltage threshold value. This helps reduce time and labor in performing design.

The descriptions heretofore deal with a method of judging whether the present time belongs to the current detectable period or the current undetectable period by using the bus current detected at the present time. However, it is also possible to judge whether an arbitrary target time point belongs to the current detectable period or the current undetectable period based on the bus current detected in the past.

This method exploits the fact that a time point (hereinafter referred to as a "first transition time point") at which the transition from the current undetectable period to the current detectable period occurs and a time point (hereinafter referred to as a "second transition time point") at which the transition from the current detectable period to the current undetectable period occurs appear at regular intervals. First, by using the method described above, it is judged whether each time point belongs to the current detectable period or the current undetectable period. Then, for example, based on the judgment results, continuous first transition time points (for example, $t_2$, $t_4$, and $t_6$ shown in FIG. 9A) are successively stored in an unillustrated memory.

Then, based on the interval between the consecutive first transition time points (for example, between $t_2$ and $t_4$) thus stored, a subsequent first transition time point is estimated. For example, in a case where the consecutive first transition time points thus stored include time points $t_F[1]$, $t_F[2]$, and $t_F[3]$, the average of the interval between the first transition time points $t_F[1]$ and $t_F[2]$ and the interval between the first transition time points $t_F[2]$ and $t_F[3]$ is calculated. Then, a time point at which the average interval thus calculated has passed from the first transition time point $t_F[3]$ is estimated as the next first transition time point $t_F[4]$. Here, the first transition time points $t_F[1]$, $t_F[2]$, $t_F[3]$, and $t_F[4]$ appear in this order. Although the above-described average interval is obtained by averaging of two intervals, it is also possible to obtain it by averaging of three or more intervals.

It is possible to perform estimating processing of the same sort for a second transition time point. If the first and second transition time points following the present time can be estimated, it is possible to judge whether an arbitrary target time point belongs to the current detectable period or the current undetectable period. If the target time point belongs to the current detectable period, it is necessary simply to detect a phase current at the target time point based on the bus current at the target time point; if the target time point belongs to the current undetectable period, it is necessary simply to perform current compensation processing described above for the target time point.

Example 2

Example 1 deals with the motor drive system in which vector control is performed such that the axis error $\Delta\theta$ between the d- and γ-axes is made to converge to zero, that is, such that the γ-axis is made to follow the d-axis; however, Example 1 may be modified to be Example 2 in which vector control is performed such that the γ-axis is made to follow an axis other than the d-axis. For example, by defining a dm-axis described in the treatise titled "Position Sensorless Vector Control for Permanent Magnet Synchronous Motors Based on Maximum Torque Control Frame" by Hida et al.; published by the Industry Applications Society of the Institute of Electrical Engineers of Japan; included in the Collection of the Lecture Treatises Presented at the 2006 Annual Conference of the Industry Applications Society of the Institute of Electrical Engineers of Japan; pp. 385-388 (I-385-I-388); August 2006, vector control may be performed such that the γ-axis is made to follow the dm-axis.

The dm-axis is an axis that lags behind the qm-axis by an electrical angle of 90 degrees. The qm-axis is the rotation axis whose direction coincides with that of the current vector to be fed to the motor 1 when maximum torque control is achieved. The current vector to be fed to the motor 1 is the current to be fed to the motor 1 and expressed in vector form. Alternatively, the qm-axis may be the rotation axis having a phase leading the rotation axis whose direction coincides with that of the current vector to be fed to the motor 1 when maximum torque control is achieved.

In a case where vector control is performed such that the γ-axis is made to follow the dm-axis, it is necessary simply to perform the following processing, for example. The estimator 26 shown in FIG. 12 estimates the axis error $\Delta\theta_m$ between the dm- and γ-axes by using all or part of $i_\gamma$ and $i_\delta$ and $v_\gamma^*$ and $v_\delta^*$, and estimates the rotor position $\theta_e$ and the rotation speed $\omega_e$ such that the axis error $\Delta\theta_m$ is made to converge to zero by using proportional-plus-integral control.

Example 3

Examples 1 and 2 deal with the motor drive systems in which position sensorless vector control is performed that uses no position sensor for detecting the rotor position. However, the techniques described in Examples 1 and 2 are useful in a case where the position sensor is provided. As Example 3 of the invention, a description will be given below of a motor drive system provided with the position sensor. In a case where the position sensor is provided, the motor drive system of Example 1 (or 2) may be modified as follows.

The estimator 26 is removed from the motor drive system shown in FIG. 12. The phase of the d-axis detected by the position sensor is treated as $\theta_e$, and is fed to the coordinate converters 22 and 25. Here, $\theta_e$ is, ideally, equal to 0 shown in FIG. 13. In addition, Oe based on the detection of the position sensor is differentiated by a differentiator (unillustrated) for speed calculation to obtain $\omega_e$, and $\theta_e$ thus obtained is fed to the speed controller 23.

Example 4

The above-described current undetectable period judging method based on the bus current can be applied to a system (device) other than the motor drive system. An example in which this method is applied to a system interconnection device will be described as Example 4.

Figure 18:
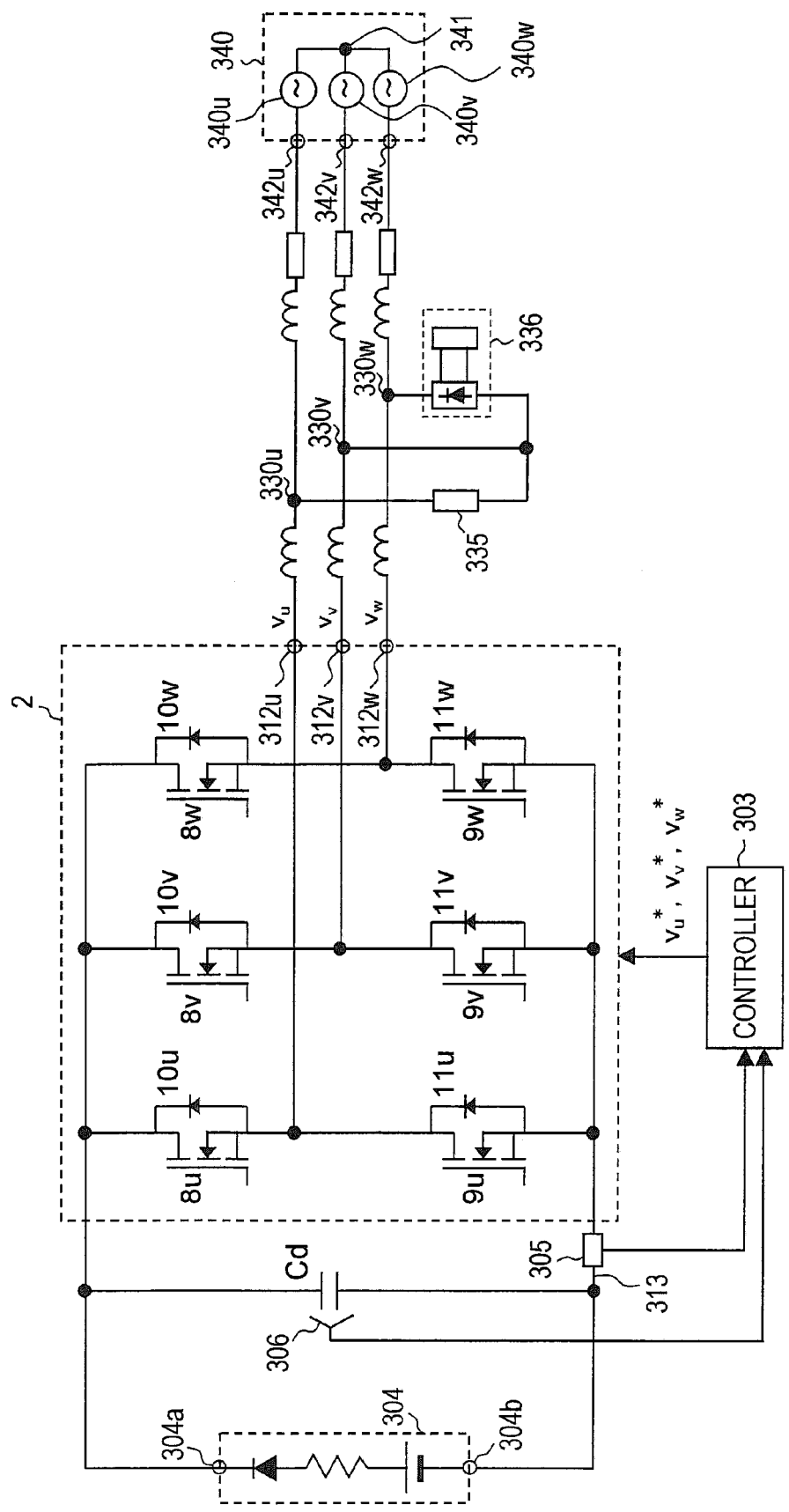
FIG. 18 is a diagram showing the overall configuration of a system interconnection device according to Example 4 of the invention.
Figure 19:
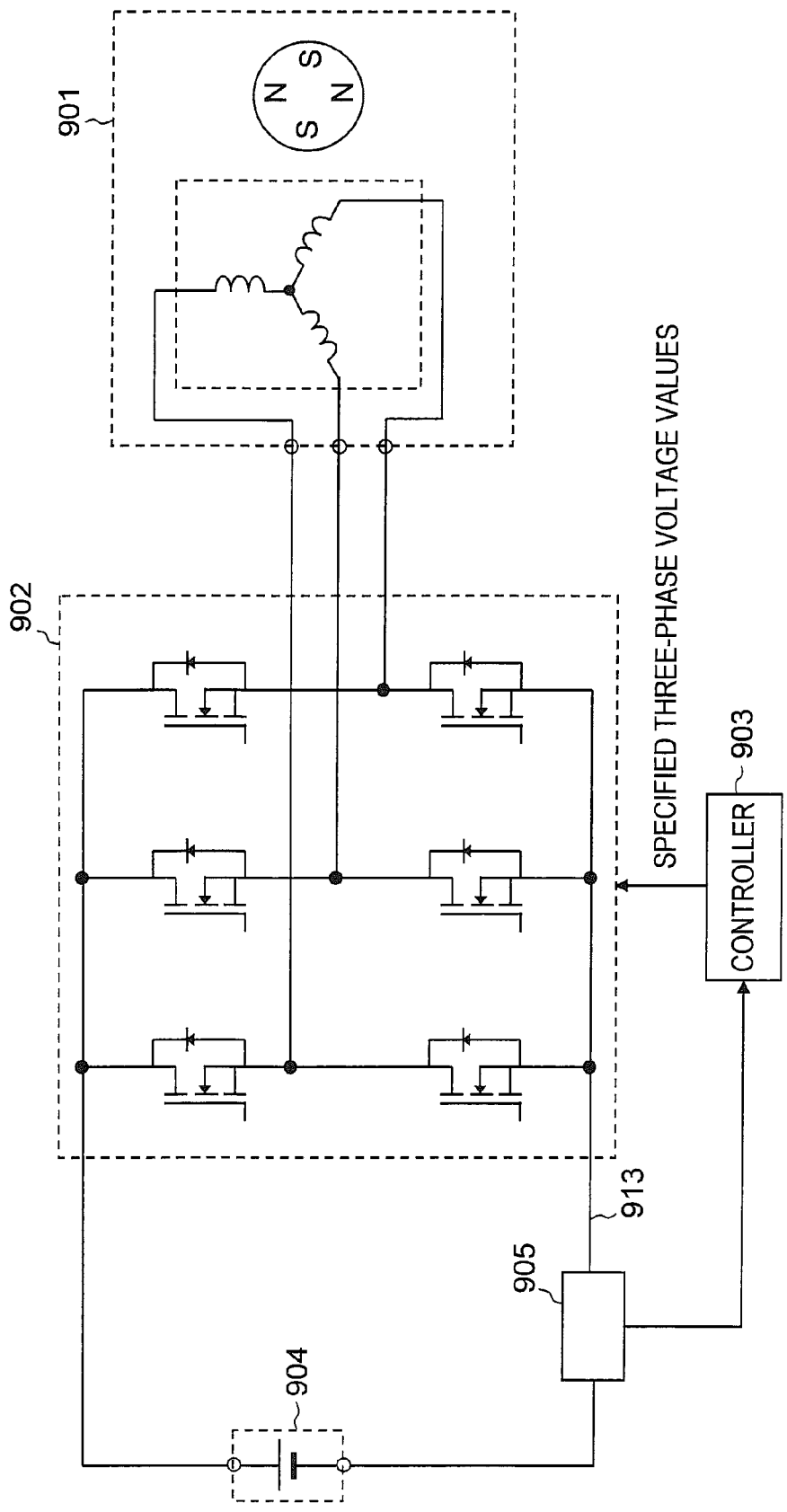
FIG. 19 is a block diagram showing the overall configuration of a conventional motor drive system in which the single shunt current detection technique is adopted.

FIG. 18 is a diagram showing the overall configuration of a system interconnection device according to Example 4. In the system interconnection device shown in FIG. 18, electricity generated by a solar cell is connected to a three-phase system by using a three-phase inverter. A control technique related to system interconnection of this type is disclosed, for example, in the treatise titled "Current Controlled Type Sinusoidal Voltage Interconnecting Three-Phase Inverter" by Yamada et al.; published by the Industry Applications Society of the Institute of Electrical Engineers of Japan; included in the Collection of the Lecture Treatises Presented at the 2007 Annual Conference of the Industry Applications Society of the Institute of Electrical Engineers of Japan; vol. 4, 4-076; p. 115; March 2007, and the technique disclosed in this treatise is applied to the system interconnection device shown in FIG. 18.

In FIG. 18, reference numeral 304 represents a solar cell serving as a direct-current power supply. FIG. 18 shows an equivalent circuit of the solar cell 304. The solar cell 304 generates electricity from solar energy, thereby producing a direct-current voltage. The direct-current voltage is produced between a positive output terminal 304a and a negative output terminal 304b, with the negative output terminal 304b serving as a lower voltage side. The direct-current voltage produced between the positive output terminal 304a and the negative output terminal 304b is applied between the terminals of a smoothing capacitor Cd, and the smoothing capacitor Cd stores electrical charge according to the direct-current voltage thus applied. A voltage detector 306 detects a voltage value of the voltage between the terminals of the smoothing capacitor Cd, and sends the detected value to a controller 303.

The inverter 2 incorporated in the system interconnection device shown in FIG. 18 is the same as that shown in FIG. 1. However, the direct-current voltage fed to the inverter 2 shown in FIG. 18 is supplied from the solar cell 304, and three output terminals 312u, 312v, and 312w of the inverter 2 are connected to interconnection points 330u, 330v, and 330w, respectively, via interconnecting reactors (inductors) and indoor wiring. The output terminals 312u, 312v, and 312w are terminals connected to the terminals 12u, 12v, and 12w, respectively, in the motor drive system shown in FIG. 1.

Incidentally, it is also possible to provide a three-phase transformer (unillustrated) between the output terminals 312u, 312v, and 312w and the interconnection points 330u, 330v, and 330w, so as to perform system interconnection by using the three-phase transformer. This three-phase transformer is provided for insulation and voltage transformation between the inverter 2 side and the system side (the side of a power system 340, which will be describe below). It is to be noted that symbols "u", "v", and "w" are generally used as symbols representing three phases of the three-phase motor, and, in the system interconnection device described in this example, symbols (for example, "a", "b", and "c") other than "u", "v", and "w" are often used as symbols representing three phases. However, for convenience of description, symbols "u", "v", and "w" are used as symbols representing three phases of the inverter 2.

Reference numeral 340 represents a power system (system-side power supply) that supplies three-phase alternating-current power. The power system 340 can be broken down into three alternating-current voltage sources 340u, 340v, and 340w, and the alternating-current voltage sources 340u, 340v, and 340w each output an alternating-current voltage with reference to a reference point 341. However, the alternating-current voltages outputted from the alternating-current voltage sources 340u, 340v, and 340w are out of phase with each other by an electrical angle of 120 degrees.

The power system 340 outputs, from the terminals 342u, 342v, and 342w, the output voltages of the alternating-current voltage sources 340u, 340v, and 340w based on the reference point 341. The terminals 342u, 342v, and 342w are connected to the interconnection points 330u, 330v, and 330w, respectively, via outdoor wiring.

Between the different interconnection points, a load such as a home electric appliance is connected. In the example shown in FIG. 18, a load 335 that is a linear load is connected between the interconnection points 330u and 330v, and a load 336 that is a nonlinear load is connected between the interconnection points 330v and 330w. As a result, the load 335 is driven by using a voltage between the interconnection points 330u and 330v as a drive voltage, and the load 336 is driven by using a voltage between the interconnection points 330v and 330w as a drive voltage. The linear load is a load that complies with Ohm's law, and the nonlinear load is a load that does not comply with Ohm's law. For example, a load including a rectifier circuit such as an AC/DC converter is assumed to be the load 336.

The inverter 2 produces PWM signals (pulse width modulation signals) for different phases based on the specified three-phase voltage values fed from the controller 303, and feeds the PWM signals thus produced to the control terminals (base or gate) of the switching elements provided in the inverter 2, so as to make the switching elements perform switching operation. The specified three-phase voltage values fed to the inverter 2 from the controller 303 include a specified U-phase voltage value $v_u{}^*$, a specified V-phase voltage value $v_v{}^*$, and a specified W-phase voltage value $v_w{}^*$ representing the voltage levels (voltage values) of a U-phase voltage $v_u$, a V-phase voltage $v_v$, and a W-phase voltage $v_w$, respectively. Based on $v_u{}^*$, $v_v{}^*$, and $v_w{}^*$, the inverter 2 controls on/off of each switching element (brings it into/out of conduction).

In this example (Example 4), the U-phase voltage $v_u$, the V-phase voltage $v_v$, and the W-phase voltage $v_w$ are voltages at the terminals 312u, 312v, and 312w, respectively, as seen from a reference potential point (for example, the reference point 341) having a given fixed potential, and the U-phase current $i_u$, the V-phase current $i_v$, and the W-phase current $i_w$ are currents flowing through the terminals 312u, 312v, and 312w, respectively. Incidentally, the polarity of a current flowing out of the terminals 312u, 312v, and 312w is assumed to be positive.

With this configuration, the solar cell 304 serving as a direct-current power supply and the power system 340 are interconnected, and the solar cell 304 supplies, to the loads 335 and 336, alternating-current power according to the three-phase alternating-current voltage from the inverter 2 in coordination with the power system 340.

The above-described single shunt current detection technique is applied to the system interconnection device shown in FIG. 18.

A current sensor 305 is the same as the current sensor 5 shown in FIG. 1, and detects a current flowing through a bus 313. This current is referred to as a "bus current". In the inverter 2, the lower arms 9u, 9v, and 9w are connected together at the lower voltage sides thereof, and are connected to the negative output terminal 304b of the solar cell 304. A conductor to which the lower arms 9u, 9v, and 9w are connected together at the lower sides thereof is the bus 313, and the current sensor 305 is connected in series to the bus 313.

As is the case with the phase voltages in the above-described motor drive system, the phase voltages ($v_u$, $v_v$, and $v_w$) of this example are sinusoidal, and which of the phase voltages is at the highest, intermediate, and lowest level varies with time (see FIG. 2). Which of the phase voltages is at the highest, intermediate, and lowest level depends on the specified three-phase voltage values, and the inverter 2 determines an energizing pattern of different phases according to the specified three-phase voltage values thus fed. There are eight energizing patterns, and they are the same as those of the motor drive system (see FIG. 3).

In addition, the relationship between the voltage levels of different phase voltages and carrier signal, and the corresponding waveforms of the PWM signals and the bus current are the same as those of the motor drive system (see FIG. 4). Furthermore, as is the case with the motor drive system, six different combinations of the maximum phase, the intermediate phase, and the minimum phase are possible (see FIG. 6). Moreover, the inverter 2 controls the switching of each arm in accordance with the specified three-phase voltage values $v_u{}^*$, $v_v{}^*$, and $v_w{}^*$ in a manner similar to that in the motor drive system. That is, the inverter 2 compares the voltage levels of phase voltages represented by $v_u{}^*$, $v_v{}^*$, and $v_w{}^*$ with a carrier signal, and controls on/off of each arm based on the comparison results.

A signal indicating a current value of the bus current (detection current) detected by the current sensor 305 is transmitted to a current detector (unillustrated) provided in the controller 303. This current detector operates in a manner similar to that of the motor current detector 21 shown in FIG. 12. That is, based on the specified three-phase voltage values $v_u{}^*$, $v_v{}^*$, and $v_w{}^*$ calculated by the controller 303, the current detector identifies which of the three phases is a maximum phase, an intermediate phase, or a minimum phase, and determines time points ST1 and ST2 (see FIG. 6) at which the output signal of the current sensor 305 is sampled. Then, the current detector calculates the three-phase currents ($i_u$, $i_v$, and $i_w$) based on the current values of the bus currents $I_{DC1}$ and $I_{DC2}$ obtained at these time points.

As is the case with the motor drive system, any time point belongs to the current detectable period or the current undetectable period. The controller 303 makes a judgment whether a time point belongs to the current detectable period or the current undetectable period. This judging method is the same as that in the motor drive system. That is, the controller 303 makes a judgment whether a target time point (for example, the present time) belongs to the current detectable period or the current undetectable period based on the bus currents $I_{DC1}$ and $I_{DC2}$ obtained from the current sensor 305. It is needless to say that any one of the first, second, and third period judgment processing can be used.

In a case where the target time point belongs to the current detectable period, the three-phase currents ($i_u$, $i_v$, and $i_w$) are calculated based on the bus current obtained at the target time point. In this case, the controller 303 performs coordinate conversion on the three-phase currents thus calculated by using the phase of the U-phase voltage $v_u$ that matches the phase of the alternating-current voltage outputted from the alternating-current voltage source 340$u$, thereby calculating an active current component and a reactive current component of the output current of the inverter 2 ($i_u$, $i_v$, and $i_w$ are U-, V-, and W-phase axis components of the output current of the inverter 2). The controller 303 calculates the specified three-phase voltage values $v_u^*$, $v_v^*$, and $v_w^*$, such that the voltage value of a voltage between the terminals of the smoothing capacitor Cd is maintained at a desired value and the reactive current component becomes zero, and feeds them to the inverter 2.

On the other hand, in a case where the target time point belongs to the current undetectable period, the controller 303 performs current compensation processing. Here, the current compensation processing described in Example 1 can be used. For example, the three-phase currents at the target time point are calculated based on the three-phase currents detected in the past. For example, in a case where the (n−1)-th carrier period is found to belong to the current detectable period, and the n-th to (n+6)-th carrier periods are found to belong to the current undetectable period, the three-phase currents based on the bus current detected in the (n−1)-th carrier period are estimated as the three-phase currents in the n-th to (n+6)-th carrier periods, and, based on the three-phase currents thus estimated, specified three-phase voltage values in the n-th to (n+6)-th carrier periods are produced.

Modifications and Variations

Hereinafter, notes 1 to 4 will be described as modified examples of the embodiment described above or annotations made thereon. Any feature of notes 1 to 4 described below can be applied, unless inconsistent, to any note other than that in connection with which the feature is specifically described.
Note 1

Any of the different specified values (such as $i_\gamma^*$, $i_\delta^*$, $v_\gamma^*$, and $v_\delta^*$) and state quantities (such as $i_\gamma$ and $i_\delta$) mentioned above, that is, any value that needs to be derived as necessary may be derived in any manner. That is, such values may be derived, for example, through calculation performed within the controller (3 or 3$a$), or may be derived from a previously set table data.
Note 2

Part or all of the functions of the controller (3 or 3$a$), for example, is realized, for example, with software (program) incorporated in a general-purpose microcomputer or the like. When the controller is realized with software, the block diagrams showing the configurations of different parts of the controller serve as functional block diagrams. Needless to say, the controller may be realized with hardware alone, instead of software, or may be realized with a combination of software and hardware.
Note 3

In the present specification, to make the description simple, state quantities and the like are often referred to by their symbols (such as $i_\gamma$) alone; for example, the "γ-axis current $i_\gamma$" is sometimes referred to simply by "$i_\gamma$", and these should be understood to represent the same thing.
Note 4

For example, it can be considered as follows. The motor drive system shown in FIG. 12 includes a current detector unit, and this current detector unit is mainly composed of the motor current detector 21. It can be considered that the current detector unit includes part of the coordinate converter 22, the speed controller 23, the current controller 24, the coordinate converter 25, and the estimator 26. In addition, it can be considered that the current detector unit includes the current sensor 5. The current detector unit includes a current detecting portion, a three-phase current detecting portion, and a judging portion, and these portions are realized with the motor current detector 21. It can also be considered that the current detecting portion is realized with the motor current detector 21 and the current sensor 5. In addition, the controller 3$a$ functions as a motor control device.

In addition, a current detector unit similar to that described above is also incorporated in the system interconnection device shown in FIG. 18. The current detector unit in the system interconnection device is mainly composed of the current detector (unillustrated) provided in the controller 303 shown in FIG. 18. It can also be considered that this current detector unit includes the current sensor 305.

The present invention is suitable for electric devices of any kind that use a motor; in particular, it is suitable for compressors for use in refrigerators, in-vehicle air-conditioning apparatuses, electric cars, and the like. The present invention can also be applied to a system interconnection device or the like.

What is claimed is:
1. A current detector unit comprising:
   a current detecting portion detecting a current flowing between a three-phase inverter and a direct-current power supply as a detection current;
   a three-phase current detecting portion for detecting a three-phase current of the inverter based on the detection current; and
   a judging portion judging, based on the detection current, whether or not a target time point belongs to a period during which the three-phase current can be detected;
   wherein, if the judging portion judges that the target time point belongs to the period, the three-phase current detecting portion detects the three-phase current;
   wherein the judging portion judges whether or not the target time point belongs to the period by comparing a magnitude of the detection current, a first-order difference value of the detection current, or a second-order difference value of the detection current with a predetermined determination threshold value; and
   wherein the determination threshold value is set to a value that is equal to or smaller than one-half of a maximum value of the detection current.

2. A motor control device, comprising:
a current detector unit, comprising
- a current detecting portion detecting a current flowing between a three-phase inverter and a direct-current power supply as a detection current;
- a three-phase current detecting portion for detecting a three-phase current of the inverter based on the detection current; and
- a judging portion judging, based on the detection current, whether or not a target time point belongs to a period during which the three-phase current can be detected;
- wherein, if the judging portion judges that the target time point belongs to the period, the three-phase current detecting portion detects the three-phase current;
- wherein the judging portion judges whether or not the target time point belongs to the period by comparing a magnitude of the detection current, a first-order difference value of the detection current, or a second-order difference value of the detection current with a predetermined determination threshold value; and
- wherein the determination threshold value is set to a value that is equal to or smaller than one-half of a maximum value of the detection current;
wherein the motor control device drives a three-phase motor by the inverter; and
wherein the motor control device detects a motor current flowing through the motor based on the three-phase current detected by the current detector unit and controls the motor via the inverter based on the motor current thus detected.

3. A motor control device comprising a current detector unit and driving a three-phase motor by a three-phase inverter,
wherein the current detector unit comprises
- a current detecting portion detecting a current flowing between the three-phase inverter and a direct-current power supply as a detection current;
- a three-phase current detecting portion for detecting a three-phase current of the inverter based on the detection current; and
- a judging portion judging, based on the detection current, whether or not a target time point belongs to a period during which the three-phase current can be detected;
- wherein, if the judging portion judges that the target time point belongs to the period, the three-phase current detecting portion detects the three-phase current;
wherein the motor control device detects a motor current flowing through the motor based on the three-phase current detected by the current detection unit and controls the motor via the inverter based on the motor current thus detected; and
wherein the motor control device,
if the judging portion judges that the target time point belongs to the period, controls the motor based on the detection current detected at the target time point, and
if the judging portion judges that the target time point does not belong to the period, controls the motor based on the detection current detected at a particular time point, the particular time point being, of time points before the target time point, a most recent one judged to belong to the period.

4. A motor drive system, comprising:
a three-phase motor;
an inverter driving the motor; and
a motor control device, comprising
a current detector unit, comprising
- a current detecting portion detecting a current flowing between a three-phase inverter and a direct-current power supply as a detection current;
- a three-phase current detecting portion for detecting a three-phase current of the inverter based on the detection current; and
- a judging portion judging, based on the detection current, whether or not a target time point belongs to a period during which the three-phase current can be detected;
- wherein, if the judging portion judges that the target time point belongs to the period, the three-phase current detecting portion detects the three-phase current;
- wherein the judging portion judges whether or not the target time point belongs to the period by comparing a magnitude of the detection current, a first-order difference value of the detection current, or a second-order difference value of the detection current with a predetermined determination threshold value; and
- wherein the determination threshold value is set to a value that is equal to or smaller than one-half of a maximum value of the detection current;
wherein the motor control device drives a three-phase motor by the inverter; and
wherein the motor control device detects a motor current flowing through the motor based on the three-phase current detected by the current detector unit and controls the motor via the inverter based on the motor current thus detected;
the motor control device controlling the motor by controlling the inverter.

5. A system interconnection device, comprising:
a current detector unit, comprising
- a current detecting portion detecting a current flowing between a three-phase inverter and a direct-current power supply as a detection current;
- a three-phase current detecting portion for detecting a three-phase current of the inverter based on the detection current; and
- a judging portion judging, based on the detection current, whether or not a target time point belongs to a period during which the three-phase current can be detected;
- wherein, if the judging portion judges that the target time point belongs to the period, the three-phase current detecting portion detects the three-phase current;
wherein the system interconnection device converts a direct-current voltage from the direct-current power supply into a three-phase alternating-current voltage by the inverter based on the detected three-phase current, and supplies three-phase alternating-current power based on the three-phase alternating-current voltage to a load in coordination with an external three-phase alternating-current power system.

* * * * *